(12) United States Patent
Park et al.

(10) Patent No.: US 8,847,223 B2
(45) Date of Patent: Sep. 30, 2014

(54) METHOD OF FORMING A PHOTOSENSITIVE PATTERN, METHOD OF MANUFACTURING A DISPLAY SUBSTRATE, AND DISPLAY SUBSTRATE

(75) Inventors: Jung-In Park, Seoul (KR); Su-Yeon Sim, Changwon-si (KR); Sang-Hyun Yun, Suwon-si (KR); Cha-Dong Kim, Hwaseong-si (KR); Hi-Kuk Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 66 days.

(21) Appl. No.: 13/407,423

(22) Filed: Feb. 28, 2012

(65) Prior Publication Data
US 2012/0241740 A1 Sep. 27, 2012

(30) Foreign Application Priority Data
Mar. 22, 2011 (KR) .................. 10-2011-0025494

(51) Int. Cl.
*H01L 29/04* (2006.01)
*G03F 7/20* (2006.01)
*H01L 27/12* (2006.01)

(52) U.S. Cl.
CPC ........ *G03F 7/70291* (2013.01); *G03F 7/70508* (2013.01); *H01L 27/1288* (2013.01)
USPC ............... 257/49; 438/694; 438/709; 438/48; 438/96; 438/97; 438/482; 438/488; 355/77; 355/71

(58) Field of Classification Search
CPC ............. G03F 7/0007; G03F 7/70508; G03F 7/70291; H01L 27/1214; H01L 27/3244; H01L 29/41733; H01L 27/1288; G03B 27/32
USPC .......... 257/49; 438/694, 709, 48, 96–97, 482, 438/488; 355/77, 71
See application file for complete search history.

(56) References Cited

U.S. PATENT DOCUMENTS

| | | | |
|---|---|---|---|
| 7,352,002 B2* | 4/2008 | Kimura et al. | 257/49 |
| 7,864,293 B2* | 1/2011 | Kato et al. | 355/53 |
| 8,014,585 B2* | 9/2011 | Kinjo | 382/141 |
| 2013/0040410 A1* | 2/2013 | Kim et al. | 438/34 |

* cited by examiner

*Primary Examiner* — Fernando L Toledo
*Assistant Examiner* — Mohammed Shamsuzzaman
(74) *Attorney, Agent, or Firm* — Innovation Counsel LLP

(57) ABSTRACT

A method of forming a photosensitive pattern on a substrate with a photosensitive layer disposed thereon may include moving at least one of the substrate and a set of micro-mirrors in a first direction, the set of micro-mirrors being disposed above the substrate and being arranged as an array, the array having a first edge extending in a second direction, the second direction being at an acute angle with respect to the first direction. The method may also include selectively turning on one or more micro-mirrors of the set of micro-mirrors according to a position of the set of micro-mirrors relative to the photosensitive layer, thereby irradiating one or more spot beams on the photosensitive layer. The photosensitive layer exposed by the spot beams is developed to form a photosensitive pattern having an edge portion extending in a third direction crossing the first and second directions.

8 Claims, 15 Drawing Sheets

METHOD OF FORMING A PHOTOSENSITIVE PATTERN, METHOD OF MANUFACTURING A DISPLAY SUBSTRATE, AND DISPLAY SUBSTRATE

CROSS-REFERENCE TO RELATED APPLICATIONS

This application claims priority under 35 U.S.C. §119 to Korean Patent Application No. 2011-25494, filed on Mar. 22, 2011 in the Korean Intellectual Property Office (KIPO), the contents of which are herein incorporated by reference in its entirety.

BACKGROUND OF THE INVENTION

1. Field of the Invention

Example embodiments of the present invention relate to a method of forming a photosensitive pattern, a method of manufacturing a display substrate, and a display substrate. More particularly, example embodiments of the present invention relate to a method of forming a photosensitive pattern using a digital exposure device (which includes micro-mirrors), a method of manufacturing a display substrate using the digital exposure device, and a display substrate.

2. Description of the Related Art

Generally, a thin-film transistor ("TFT") and signal lines electrically connected to the TFT are formed by a photolithography process. The photolithography process includes an exposure step, a developing step, and an etching step. In the exposure step, a photoresist pattern is formed using a mask, which is associated with a design of a metal pattern, and an exposure device. Whenever the design of the metal pattern is changed, a design of the mask needs to be changed; therefore, the number of the masks depends on the number of the metal patterns. Since the cost of manufacturing the mask is significantly high, the mask used for the photolithography process substantially increases the manufacturing cost of display substrates, and therefore substantially increases the production cost of display devices.

Recently, in order to solve the above-mentioned problem, a digital exposure device using an optical element including a plurality of micro-mirrors capable of providing a plurality of spot beams onto a substrate without using an additional mask has been used. In the digital exposure device, the micro-mirrors are individually turned on or off, and the spot beams respectively corresponding to the micro-mirrors turned on are provided to the substrate, so that a specific area of the substrate is selectively exposed. Thus, a shape of a photoresist pattern may be determined by an operation time of turning on/off the micro-mirrors and an irradiated position of the spot-beams.

Typically, the digital exposure device theoretically calculates the irradiated position of the spot beams prior to turning on or off the micro-mirrors, and the theoretically calculated irradiated position and the actual irradiated position of the spot beams are usually different from each other. Because of the difference between the theoretically calculated irradiated position and the actual irradiated position, a predetermined position preset by an operator may not receive a light with sufficient light intensity, and thus a photoresist pattern formed using the digital exposure device has portions in which the light is not desirably provided. As a result, the reliability of the photoresist pattern and the pattern formed using the photoresist pattern may be undesirable.

SUMMARY OF THE INVENTION

One or more embodiments of the present invention provide a method of forming a photosensitive pattern capable of improving the reliability of a manufacturing process.

One or more embodiments of the present invention provide a method of manufacturing a display substrate using the above-mentioned method.

One or more embodiments of present invention are related to a display substrate with desirable reliability.

One or more embodiments of the present invention are related to a method of forming a photosensitive pattern on a substrate, a photosensitive layer being disposed on the substrate. The method may include moving at least one of the substrate and a set of micro-mirrors in a first direction, the set of micro-mirrors being disposed above the substrate and being arranged as an array, the array having a first edge extending in a second direction, the second direction being at an acute angle with respect to the first direction. The method may also include selectively turning on one or more micro-mirrors of the set of micro-mirrors according to a position of the set of micro-mirrors relative to the photosensitive layer, thereby irradiating one or more spot beams on the photosensitive layer. In one or more embodiments, the substrate may have a side extending in the first direction. The photosensitive layer exposed by the spot beams may be developed to form a photosensitive pattern having an edge portion extending in a third direction crossing the first and second directions.

In an embodiment, a first spot beam corresponding to a first micro-mirror of the micro-mirrors at a first exposed point on a pattern-formed region in which the photosensitive pattern is formed may be irradiated. After irradiating the first spot beam, a second spot beam corresponding to a second micro-mirror of the micro-mirrors at a second exposed point on the pattern-formed region disposed in the third direction of the first exposed point may be irradiated. Then, the second micro-mirror may be disposed in the second direction with respect to the first micro-mirror.

In an embodiment, when the first spot beam is irradiated, the first micro-mirror may be disposed over the first exposed point and may receive activating data, and the second micro-mirror may be disposed over a light-blocking point in a peripheral region outside of the pattern-formed region and may receive inactivating data. In addition, when the second spot beam is irradiated, the second micro-mirror may be disposed over the second exposed point (which is disposed in the first direction with respect to the light-blocking point and may receive the activating data.

In an embodiment, the method may also include dividing the photosensitive pattern into a plurality of lattice units having a parallelogram shape defined by first sides facing each other and second sides respectively connecting the first sides, the parallelogram shape having no right-angle corner, a length of the first sides is substantially equal to a distance between the first exposed point and the second exposed point, a length of the second sides being substantially equal to a moving distance of the first micro-mirror relative to the substrate from an on-state of the first micro-mirror to an off-state of the first micro-mirror.

One or more embodiments of the inventions are related to a method of manufacturing a display substrate. In the method, a gate pattern is formed on a base substrate having a side extending in a first direction. The gate pattern includes a gate line and a gate electrode connected to the gate line. A photoresist pattern is formed on a semiconductor layer and a source metal layer formed on the gate pattern. The steps of forming the photoresist pattern may include moving at least one of the base substrate and a set of micro-mirrors in the first direction, the set of micro-mirrors being disposed above the base substrate and being arranged as an array, the array having a first edge extending in a second direction, the second direction being at an acute angle with respect to the first direction. The steps of forming the photoresist pattern may also include selectively turning on one or more micro-mirrors of the set of micro-mirrors according to a position of the set of micro-mirrors relative to a photosensitive layer disposed on the base substrate, thereby irradiating one or more spot beams on the photosensitive layer. A source pattern and an active pattern are formed using the photoresist pattern as an etch stopping layer. The source pattern has an edge portion extending in a third direction crossing the first and second directions, and includes a source electrode, a drain electrode and a data line. The data line is connected to the source electrode and extends in the first direction. A pixel electrode is formed on the base substrate on which the source pattern and the active pattern are formed. The pixel electrode is connected to the drain electrode.

In an embodiment, the photoresist pattern may include a first thickness portion formed in a pattern-formed region of the source pattern and a second thickness portion formed in a channel region between the source electrode and the drain electrode. The second thickness portion may be thinner than the first thickness portion. Then, the number of the spot beams per unit area irradiated in the formed region of the source pattern may be different from that of the spot beams per unit area irradiated in the channel region.

In an embodiment, a gate metal layer may be patterned using the digital exposure device to form the gate line extending in the third direction and a gate electrode having an edge portion extending in the third direction.

In an embodiment, after forming an electrode layer on the base substrate on which the source pattern and the active pattern are formed, the electrode layer may be patterned using the digital exposure device to form first and second sub electrodes. The first sub electrode may include a plurality of first slit electrodes inclined with respect to a reference line extending in the third direction. The second sub electrode may include a plurality of second slit electrodes respectively connected to the first sub electrodes and extending in a direction substantially perpendicular to an extending direction of the first slit electrodes.

One or more embodiments of the present invention are related to a display substrate. The display substrate includes a data line extending in a first direction, a gate line crossing the data line, a switching element, and a pixel electrode. The switching element includes a gate electrode connected to the gate line, a source electrode having an edge portion extending in a second direction between the first direction and a third direction substantially perpendicular to the first direction, and a drain electrode spaced apart from the source electrode and having an edge portion extending in the second direction. The pixel electrode is electrically connected to the switching element.

In an embodiment, the gate line may extend in the second direction, and the gate electrode comprises an edge portion extending in the second direction.

In an embodiment, the display substrate may further include an organic insulating layer covering the switching element and including a contact hole partially exposing the drain electrode. Then, the contact hole may be surrounded by first sidewalls extending in the first direction and second sidewall connected to the first sidewalls and extending in the second direction.

In an embodiment, the pixel electrode may include a first sub electrode including a plurality of first slit electrodes inclined with respect to a reference line extending in the second direction and a second sub electrode connected to the first sub electrode and including a plurality of second slit electrodes extending in a direction substantially perpendicular to an extending direction of the first slit electrodes. Then, if an acute angle between the second direction and the third direction is referred to "$\theta$" ($0°<\theta<45°$), each of the first slit electrodes may be inclined in a counterclockwise direction with respect to the third direction by ($45°-\theta$), and each of the second slit electrodes may be inclined in a clockwise direction with respect to the third direction by ($45°+\theta$).

According to the present invention, a thin-film pattern is designed such that an edge portion of the thin-film pattern is disposed to extend along a direction inclined with respect to a longitudinal direction of a side of a base substrate, and the thin-film pattern is formed by a digital exposure device. Thus, a final manufactured thin-film pattern is most like a theoretically designed thin-film pattern. In other words, the operator designs the thin-film pattern using a design tool including lattice units and each of the lattice units has a parallelogram shape which is based on an exposure characteristic of the digital exposure device, so that the final manufactured thin-film pattern is most like the theoretically designed thin-film pattern even though the thin-film pattern is formed by the digital exposure device.

Therefore, although manufacturing conditions are changed, the operator may predict actually exposed positions so that the thin-film pattern may be easily redesigned to improve a reliability of manufacturing the thin-film pattern. In addition, the reliability of a display substrate including the thin-film pattern or formed using the thin-film pattern and the reliability of manufacturing the display substrate may be improved.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Hereinafter, the present invention will be explained in detail with reference to the accompanying drawings.

Figure 1:
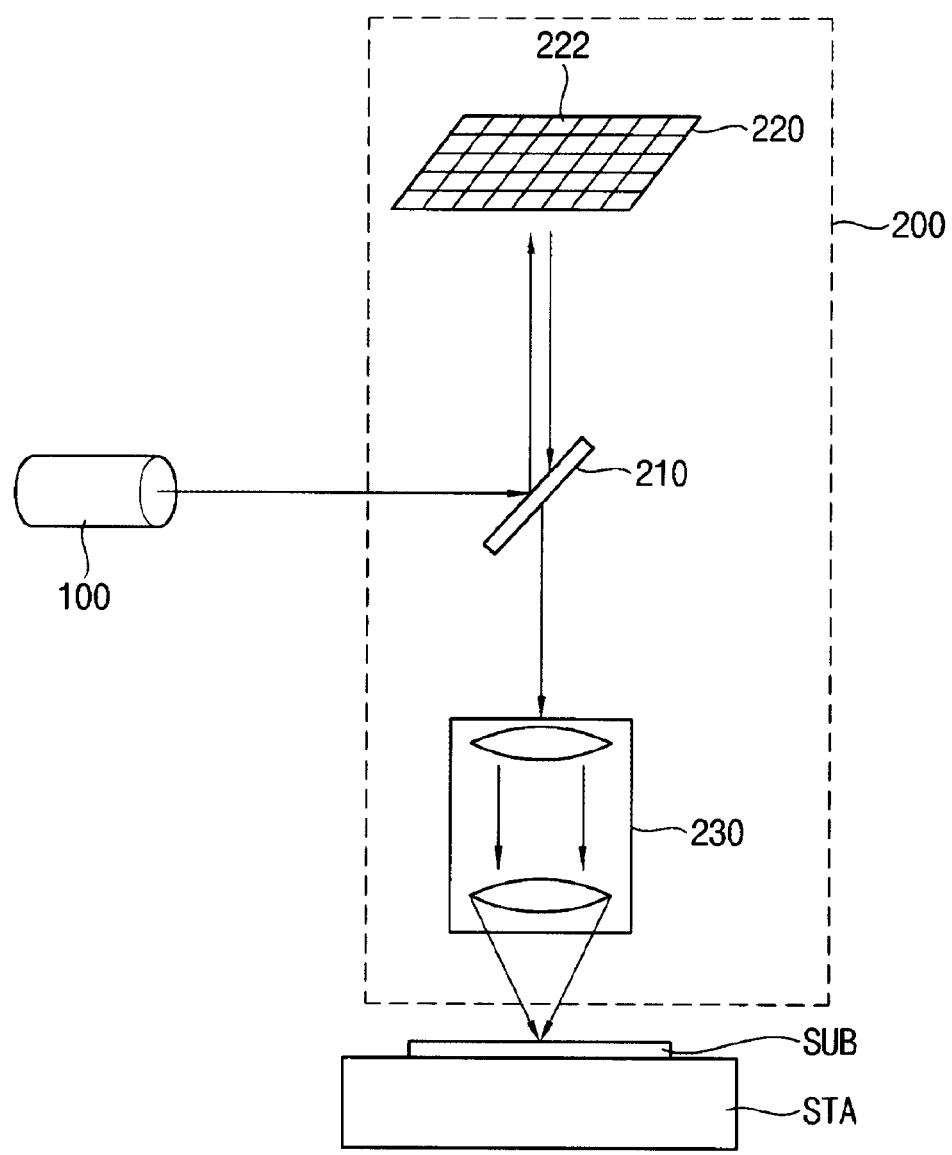
FIG. 1 is a conceptual view illustrating a digital exposure device for forming a photosensitive pattern according to one or more embodiments of the present invention.
Figure 2A:
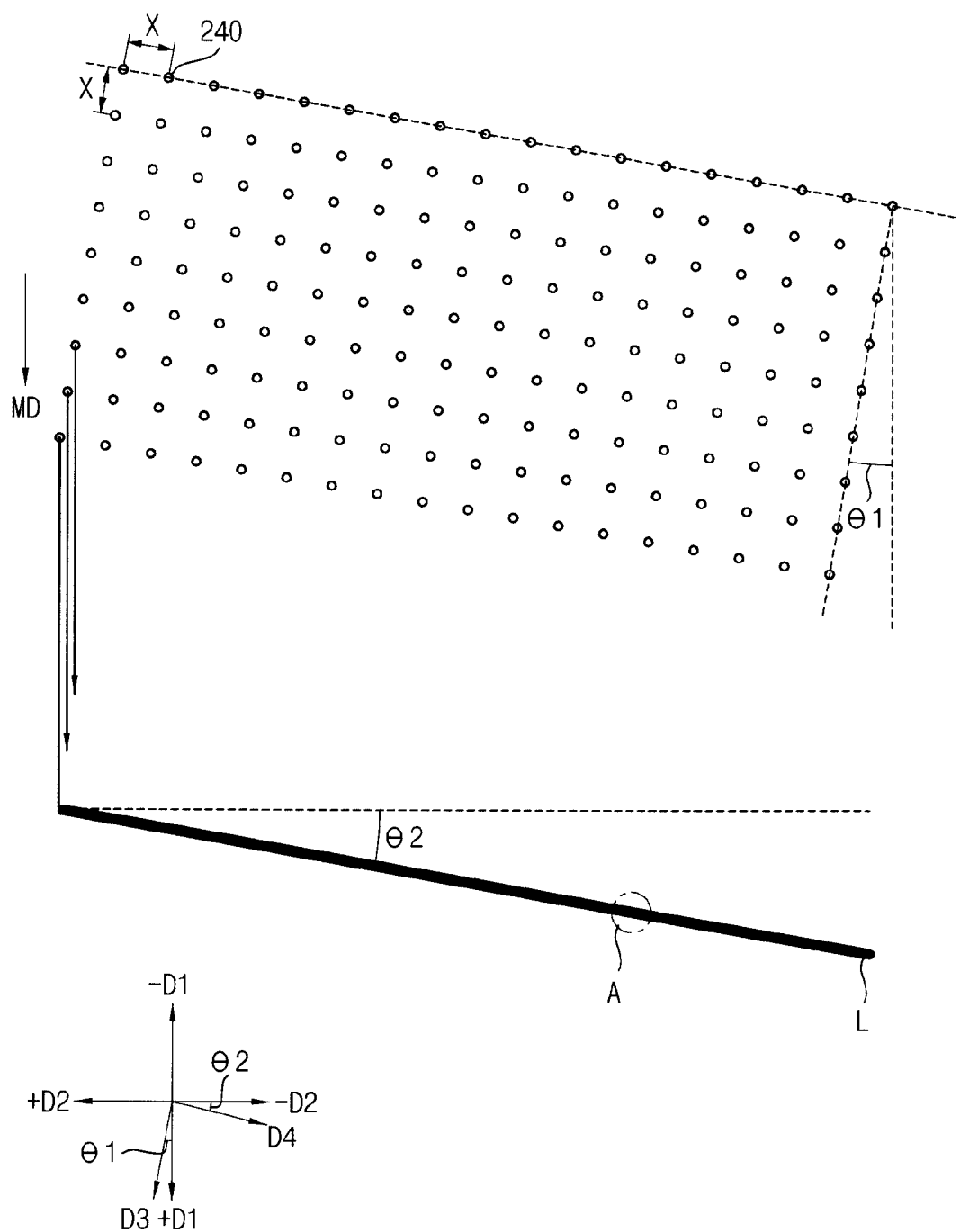
FIG. 2A is a plan view illustrating an exposure step performed on a photosensitive layer using an optical head in FIG. 1.
Figure 2B:
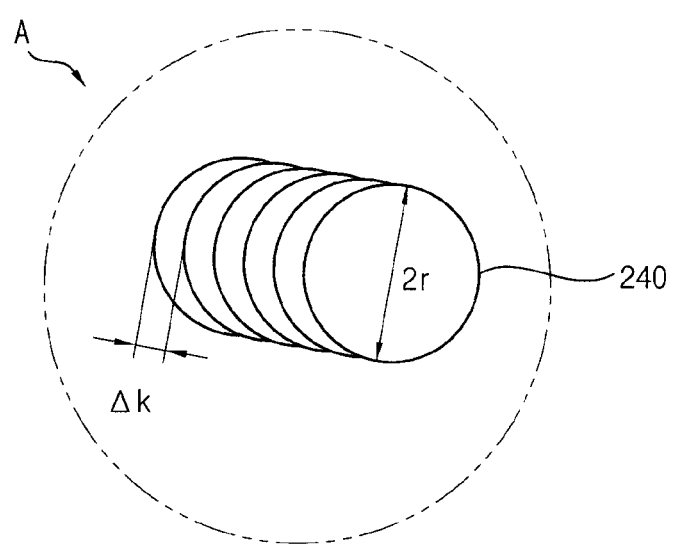
FIG. 2B is an enlarged plan view of a portion 'A' in FIG. 2A.

FIG. 1 is a conceptual view illustrating a digital exposure device for forming a photosensitive pattern according to one or more embodiments of the present invention. FIG. 2A is a plan view illustrating an exposure step performed on a photosensitive layer using an optical head in FIG. 1, and FIG. 2B is an enlarged view of a portion 'A' in FIG. 2A.

As illustrated in the example of FIG. 1, the digital exposure device includes a light source 100 generating a light, an optical head 200 receiving the light from the light source 100, and a stage STA receiving the light from the optical head 200. Operation of the digital exposure device is now discussed.

The light source 100 emits a laser beam to the optical head 200.

The optical head 200 includes a beam splitter 210, a digital micro-mirror device ("DMD") 220, and an optical system 230.

The beam splitter 210 may reflect and transmit the laser beam emitted from the light source 100. The laser beam reflected by the beam splitter 210 is provided to the DMD 220. The beam splitter 210 transmits the light (or reflected beams) received from the DMD 220 to provide the light (or reflected beams) to the optical system 230.

The DMD 220 includes a plurality of micro-mirrors 222. The micro-mirrors 222 may be arranged as an m×n array. Each of the micro-mirrors 222 may reflect the light (or laser beam) received from the beam splitter 210. The DMD 220 may selectively reflect the light (or laser beam) received from the beam splitter 210 based on image data for forming an image on a substrate SUB disposed on the stage STA.

Although not shown in figures, the optical head 200 may further include a mirror controlling part controlling each of the micro-mirrors 222 based on the image data. The mirror controlling part may output a control signal, which may include activating data or inactivating data, for turning on or turning off the micro-mirrors 222. When substantially all the micro-mirrors 222 receive activating data, the number of reflected beams provided to the optical system 230 is substantially the same as the number of the micro-mirrors 222.

The optical system 230 includes a plurality of lenses. The optical system 230 transforms the reflected beams provided from the DMD 220 into a plurality of spot beams 240 illustrated in the example of FIG. 2. The optical system 230 concentrates the reflected beams emitted from the DMD 220 and increases a distance between the reflected beams (and/or increases the distance X between the centers of the spot beams 240).

The digital exposure device irradiates the spot beams 240 onto the substrate SUB disposed on the stage STA so that a photosensitive layer (not shown) formed on the substrate SUB is exposed. Hereinafter, "exposing the substrate SUB" is defined to be substantially the same as exposing the photosensitive layer formed on the substrate SUB.

The digital exposure device is oriented such that an edge of the array of the micro-mirrors 222 incline by a first angle $\theta_1$ with respect to a side of the substrate SUB extending in a first direction +D1 and −D1. When a second direction +D2 and −D2 defines a direction substantially perpendicular to the first direction +D1 and −D1, an inclined direction of the digital exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the digital exposure device may be a third direction D3 between the positive first direction +D1 and the positive second direction +D2. The first angle $\theta_1$ is defined as an acute angle clockwise rotated with respect to a reference line extending in the first direction +D1 and −D1. For example, the first angle $\theta_1$ may be between about 0.1° and about 0.5°.

The digital exposure device that is inclined with respect to the third direction D3 provides the spot beams 240 onto the substrate SUB along a scanning direction MD. The scanning direction MD is substantially the same as the first positive direction +D1. When the first angle $\theta_1$ of the digital exposure device is about 0° and the digital exposure device exposes the substrate SUB along the positive first direction +D1, a region between the spot beams 240 adjacent to each other of the substrate SUB is not exposed. Therefore, in order to entirely expose a predetermined region, the digital exposure device is oriented to incline with respect to the substrate SUB by the first angle $\theta_1$, such that adjacent spot beams may scan along different paths on the substrate SUB (instead of scanning completely overlapped or repeated paths on the substrate SUB) when the digital exposure device provides the light onto the substrate SUB.

When the micro-mirrors 222 receive the activating data and when the spot beams 240 are irradiated onto the substrate SUB (which is stopped), the spot beams 240 are spaced apart from each other in the third direction D3 by a predetermined distance "x." In addition, the spot beams 240 are spaced apart from each other in a direction substantially perpendicular to the third direction D3 by the determined distance "x."

In order to selectively expose a predetermined region of the substrate SUB, for example, a pattern-formed region L, the spot beams 240 are selectively irradiated in the pattern-formed region L. As an example, the pattern-formed region L is defined as a region extending along a fourth direction D4 inclining clockwise in a direction with respect to a side of the substrate SUB by a second angle $\theta_2$. The pattern-formed region L may be designed (by an operator) to have a rectangular shape extending in the fourth direction D4. When the digital exposure device exposes the pattern-formed region L, as illustrated in the example of FIG. 2B, adjacent spot beams of the spot beams 240 (which are of a circular shape having a diameter "2r") partially overlap with each other according to a predetermined edge-to-edge distance "Δk" in the pattern-formed region L without completely overlapping each other, so that the substrate SUB of the pattern-formed region L is entirely exposed and the exposure may be substantially uniform.

Hereinafter, in FIGS. 3 to 16, a spot beam region corresponding to a micro-mirror of the micro-mirrors 222 in FIG. 1 when the micro-mirror receives inactivating data is expressed by "●", and a spot beam region corresponding to a micro-mirror of the micro-mirrors 222 when the micro-mirror receives activating data is expressed by "○". For example, a spot beam region that corresponds to a micro-mirror when the micro-mirror receives the inactivating data does not receive a spot beam, so that the substrate SUB is not exposed in the spot beam region.

On the other hand, a spot beam region that corresponds to a micro-mirror when the micro-mirror receives the activating data receives a spot beam, so that the substrate SUB is exposed in the spot beam region. The spot beam regions expressed by "○" in FIGS. 3 to 16 are regions in which the spot beams 240 are actually irradiated. For all spot beams, the distance "x" between the spot beam regions adjacent to each other (or the distances between the centers of the adjacent spot beam regions) is substantially the same as each other. The distance "x" between the spot beam regions is defined to be substantially the same as the distance "x" between the spot beams 240 adjacent to each other irradiated onto the substrate SUB when the digital exposure device and the substrate SUB are stationary and when the spot beams 240 are irradiated onto the substrate SUB corresponding to each of the spot beam regions.

First, an exposure method for selectively irradiating the spot beams 240 in the pattern-formed region L in FIG. 2A will be discussed with reference to FIG. 3.

Figure 3:
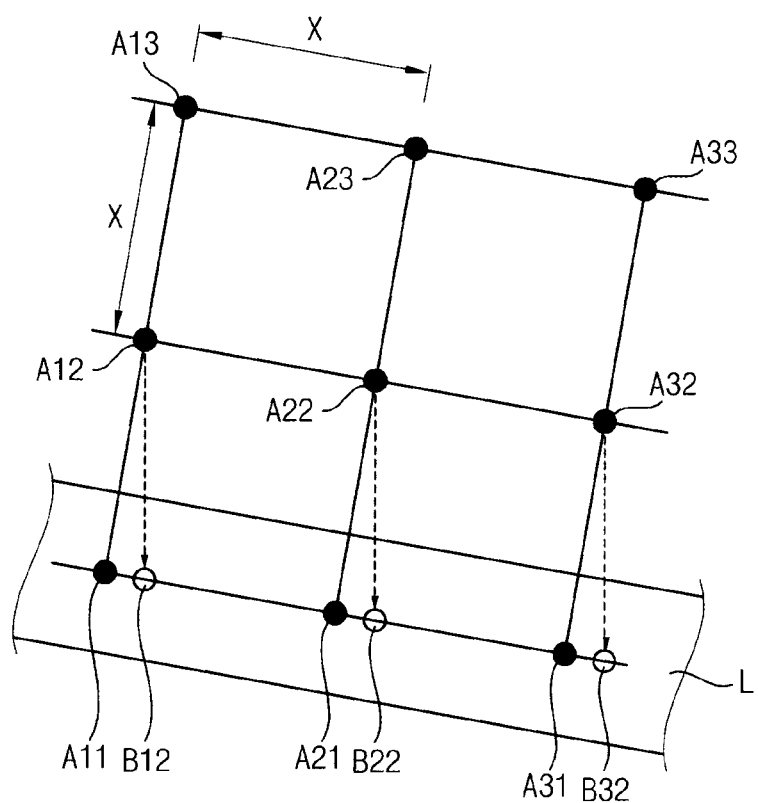
FIG. 3 is a plan view of spot beam regions illustrating an exposed position associated with a plurality of spot beams in FIG. 2A.
Figure 3:
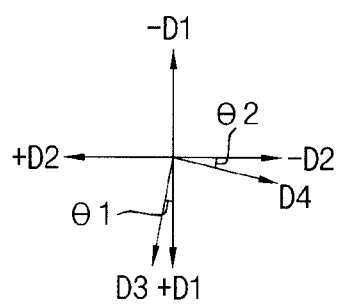
Figure 4:
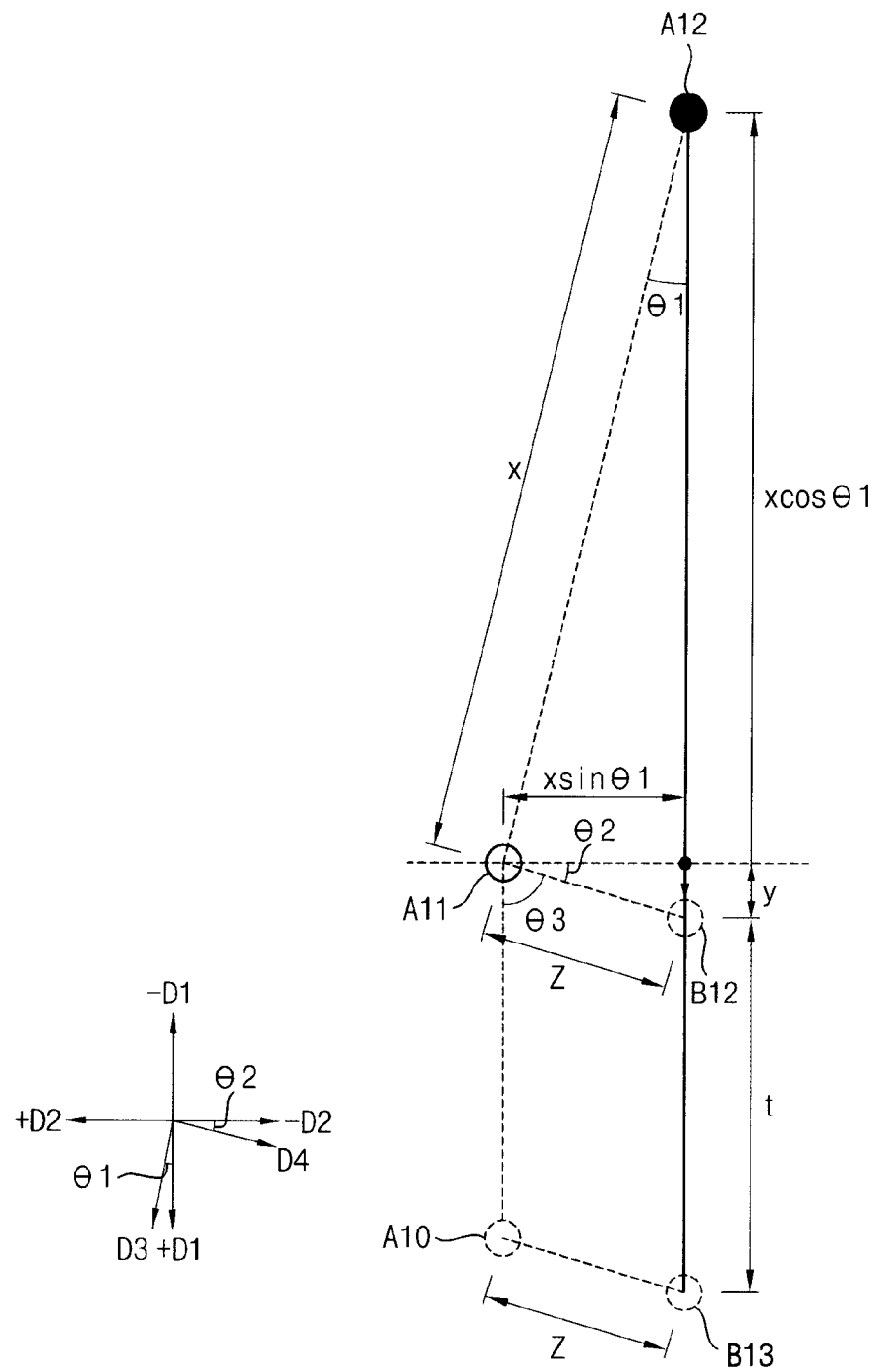
FIG. 4 is an enlarged plan view illustrating a relation between the exposed positions of the spot beam regions adjacent to each other in a first direction illustrated in FIG. 3.

FIG. 3 is a plan view of spot beam regions illustrating an exposed position associated with a plurality of spot beams in FIG. 2A. FIG. 4 is an enlarged plan view illustrating a relation between the exposed positions of the spot beam regions adjacent to each other in a first direction in FIG. 3.

Referring to FIGS. 2A, 3, and 4, a spot beam region corresponding to a first micro-mirror overlapping with the pattern-formed region L is defined as a "first spot beam region A11". When the first micro-mirror receives the activating data, the first spot beam region A11 is a "first exposed point" of the substrate SUB. A second spot beam region A12 corresponding to a second micro-mirror and a third spot beam region A13 corresponding to a third micro-mirror are arranged along a direction opposite to the third direction D3 with respect to the first spot beam region A11. When the second and third spot beams A12 and A13 are disposed in a peripheral region outside of the pattern-formed region L, each of the second and third micro-mirrors receives the inactivating data. Thus, the second spot beam region A12 is a "light-blocking point" and the third spot beam region A13 is also a light-blocking point different from the second spot beam region A12.

For example, when the second spot beam region A12 overlaps with the peripheral region, the second micro-mirror receives the inactivating data so that the second spot beam region A12 is a light-blocking point. Alternatively, when the second spot beam region A12 overlaps with the pattern-formed region L, the second micro-mirror receives the activating data to provide a second spot beam to the second spot beam region A12 so that the second spot beam region A12 may be a "second exposed point" (illustrated by a region B12 in the example of FIG. 3). The second exposed point is disposed in the fourth direction D4 with respect to the first exposed point.

A distance "x" between the first and second spot beam regions A11 and A12 is substantially the same as a distance "x" between the first spot beam region A11 and a fourth spot beam region A21. Among the spot beam regions A11, A12, A13, A21, A22, A23, A31, A32, and A33, which are arranged as an array, spot beam regions that are adjacent to each other are spaced apart from each other by an equal interval "x".

When the pattern-formed region L and the first spot beam region A11 overlap with each other, as shown in FIG. 3, the first micro-mirror receives the activating data to irradiate the first spot beam in the pattern-formed region L. At the same time, the second and third spot beam regions A12 and A13 are disposed in the peripheral region so that the second micro-mirror (corresponding to the second spot beam region A12) and a third micro-mirror corresponding to the third spot beam region A13 receive the inactivating data.

In addition, the fourth spot beam region A21 and a fifth spot beam region A31 are sequentially arranged along the fourth direction D4 with respect to the first spot beam region A11. Sixth and seventh spot beam regions A22 and A23 are arranged along a direction opposite to the third direction D3 with respect to the fourth spot beam region A21. Eighth and ninth spot beam regions A32 and A33 are arranged along the direction opposite to the third direction D3 with respect to the third spot beam region A31.

When the first spot beam region A11 overlaps with the pattern-formed region L, the fourth spot beam region A21 and the fifth spot beam region A31 overlap with the pattern-formed region L. For example, a fourth micro-mirror corresponding to the fourth spot beam region A21 receives the activating data, and a fifth micro-mirror corresponding to the fifth spot beam region A31 receives the activating data, so that a fourth spot beam and a fifth spot beam are irradiated in the pattern-formed region L. Thus, the fourth and fifth spot beam regions A21 and A31 are respectively third and fourth exposed points. At the same time, the sixth, seventh, eighth, and ninth spot beam regions A22, A23, A32, and A33 do not overlap with the pattern-formed region L; therefore, sixth, seventh, eighth, and ninth micro-mirrors respectively corresponding to the sixth, seventh, eighth, and ninth spot beam regions A22, A23, A32, and A33 receive the inactivating data. As a result, each of the sixth, seventh, eighth, and ninth spot beam regions A22, A23, A32 and A33 is a light-blocking point.

When the substrate SUB receiving the first spot beam in the pattern-formed region L is firstly moved such that the digital exposure device 200 is shifted relative to the substrate SUB in the scanning direction MD by a predetermined distance, the first, fourth, and fifth spot beams regions A11, A21, and A31 may become out of the pattern-formed region L. Then (or substantially at the same time), the first, fourth, and fifth micro-mirrors respectively corresponding to the first, fourth, and fifth spot beams regions A11, A21, and A31 may receive the inactivating data (from the mirror controlling part). As a result, each of the first, fourth and fifth spot beam regions A11, A21, and A31 may become a light-blocking point in the peripheral region. On the other hand, the second, sixth, and eighth spot beam regions A12, A22, and A32 may overlap with the pattern-formed region L, so that the second, sixth, and eighth micro-mirrors may receive the activating data (from the mirror controlling part) to irradiate the second, sixth, and eighth spot beams in the pattern-formed region L, respectively. Thus, each of the second, sixth, and eighth spot beam regions A12, A22 and A32 may become an exposed point in the pattern-formed region L.

When the second, sixth and eighth spot beam regions A12, A22, and A32 overlap with the pattern-formed region L, the second spot beam is irradiated in a first region B12 adjacent to the first exposed point where the first spot beam has been irradiated. The first region B12 is disposed in the fourth direction D4 with respect to the first spot beam region A11. The first region B12 is the second exposed point disposed adjacent to the first exposed point and disposed in the fourth direction D4 with respect to the first exposed point. When the second, sixth, and eighth spot beam regions A12, A22, and A32 are disposed in the pattern-formed region L, the first micro-mirror corresponding to the first spot beam region A11 has already been moved from the pattern-formed region L to a peripheral region, and the micro-mirror corresponding to the first spot beam region A11 in the peripheral region receives the inactivating data. Nevertheless, hereinafter a region in which the first spot beam is irradiated in a previous step will be illustrated referring to "the first spot beam region A11 as the first exposed point in which the first spot beam is irradiated" in FIG. 3 for convenience. The fourth and fifth spot beam regions A21 and A31 refer to regions in which the fourth spot beam and the fifth spot beam are respectively irradiated in FIG. 3.

The sixth spot beam is irradiated in a second region B22 adjacent to the fourth spot beam region A21 as the third exposed point in which the fourth spot beam is irradiated. The second region B22 is disposed in the fourth direction D4 with respect to the fourth spot beam region A21. The second region B22 is a fifth exposed point disposed adjacent to the third exposed point and in the fourth direction D4 with respect to the third exposed point. The eighth spot beam is irradiated in a third region B32 adjacent to the fifth spot beam region A31 as the fourth exposed point in which the fifth spot beam is irradiated. The third region B32 is disposed in the fourth direction D4 with respect to the fifth spot beam region A31. The third region B32 is a sixth exposed point disposed adjacent to the fourth exposure and in the fourth direction D4 with respect to the fourth exposed point.

When the substrate SUB is secondly moved such that the digital exposure device 200 is shifted relative to the substrate SUB in the scanning direction MD by a predetermined distance, although not shown in figures, the third spot beam may be irradiated in a region disposed along the fourth direction D4 with respect to the first region B12 in the pattern-formed region L adjacent to the first region B12, the second exposed point. In addition, the seventh spot beam may be irradiated in a region disposed along the fourth direction D4 with respect to the second region B22 in the pattern-formed region L adjacent to the second region B22, the fifth exposed point. The ninth spot beam may be irradiated in a region disposed along the fourth direction D4 with respect to the third region B32 in the pattern-formed region L overlapping with the third region B32, the sixth exposed point.

When the substrate SUB is continuously moved such that the digital exposure device 200 is continuously shifted relative to the substrate SUB in the scanning direction MD substantially same as the above described ways in which the substrate SUB is firstly and secondly moved in a direction opposite to the scanning direction MD with respect to the digital exposure device 200, the spot beams 240 entirely expose the pattern-formed region L, and the spot beams 240 irradiated in the pattern-formed region L partially but not completely overlap with each other, as illustrated in the example of FIG. 2A.

As illustrated in FIGS. 3 and 4, when an operating interval, which is a minimum relative moving distance of the digital exposure device (or at least a micro-mirror of micro-mirrors 222) from a turning-on state to a turning-off state of the micro-mirror of the micro-mirrors 222, is referred to "t", a relative moving distance of the substrate SUB is referred to "n×t", which may be the integer multiple of "t" that is closest to "x" (wherein "n" is an integer equal to or greater than 1). When the distance "x" between the first and second spot beam regions A11 and A12 is larger than the operating interval "t", the second micro-mirror may be at least twice (relatively) moved from the second spot beam region A12 toward the positive first direction +D1 in order to (relatively) move the second micro-mirror from the second spot beam region A12 to the first region B21.

For example, the distance "x" is about 10 μm and the operating interval "t" is about 1 μm, the second micro-mirror is continuously (and relatively) moved about 10 times between the second spot beam region A12 and the first region B12 in order to (relatively) move the second spot beam region A12, a light-blocking point, to the first region B12 to form an exposed point. The second micro-mirror disposed in the second spot beam region A12 in FIG. 4 receives the inactivating data, and the second micro-mirror (relatively) moved by about 1 μm in the positive first direction +D1 may receive the activating data or the inactivating data. In addition, the second micro-mirror receives the activating data or the inactivating data when the second micro-mirror is (relatively) moved by about 2 μm from the second spot beam region A12. When the second micro-mirror is disposed at the first region B12 (as a result of moving the substrate SUB), at a distance from the second spot beam region A12, the second micro-mirror receives the activating data to irradiate the second spot beam in the first region B12 so that the first region B12 may be the second exposed point.

According to one or more embodiments, the digital exposure device 200 is inclined with respect to the third direction D3 and is (relatively) moved along the scanning direction MD, so that the first spot beam region A11 as the first exposed point and the first region B12 as the second exposed point in the pattern-formed region L are arranged along the fourth direction D4, aligned with the extending direction of the pattern-formed region L designed by the operator. Therefore, the spot beams 240 may be actually irradiated in regions theoretically selected in order to form a pattern according to a design required by the operator.

A method for designing the pattern-formed region L to coincide with actually exposed regions is discussed with reference to FIGS. 4 and 5.

FIG. 4 is an enlarged plan view illustrating a relation between the exposed positions of the spot beam regions adjacent to each other in a first direction illustrated in FIG. 3.

For example, FIG. 4 illustrates the first spot beam region A11, the second spot beam region A12, and the first region B12 shown in FIG. 3. When the first spot beam is irradiated in the first spot beam region A11 overlapping with the pattern-formed region L, the second micro-mirror receives the inactivating data in the peripheral region so that the second spot beam is not irradiated in the second spot beam region A12. Thus, the spot beam region A11 overlapping with the pattern-formed region L is the first exposed point, and the second spot beam A12 overlapping with the peripheral region is the light-blocking point.

The second micro-mirror of the micro-mirrors 222 is (relatively) moved by "n×t" (Here, "n×t" is the integer multiple of "t" that is closest to "x", and "n" is an integer equal to or greater than 1) to overlap with the first region B12 in the pattern-formed region L. The first region B12 is the second exposed point. When the second micro-mirror is (relatively) moved by "(n−1)×t" to be disposed in the peripheral region, a region spaced apart from the second spot beam region A12 by "(n−1)×t" is a light-blocking point at which the second spot beam is not irradiated. The first region B12, the second exposed point, is reached when the second micro-mirror is further (relatively) moved by a predetermined distance "y" in the positive first direction +D1 from a reference line, the first spot beam region A11, the first exposure region being disposed at the reference line extending in the second direction +D2 and −D2, since the time for providing the activating or inactivating data to the second micro-mirror does not coincide with the time at which the second micro-mirror crosses the reference line. The predetermined distance "y" is expressed by Equation 1.

$$y = |n \times t - x \cos(\theta_1)| \qquad \text{<Equation 1>}$$

In Equation 1, "n×t" is the integer multiple of "t" that is closest to "x", and "n" is an integer equal to or greater than 1.

Therefore, the first region B12 is disposed in the fourth direction D4 with respect to the first spot beam region A11 so that the second exposed point may be determined as a point disposed along the fourth direction D4 with respect to the first exposed point. A second angle $\theta_2$ (0°<$\theta_2$<90°) designates the acute angle formed between the reference line and a line defined by the second direction +D2 and −D2. The second angle $\theta_2$, distance "z" between the first spot beam region A11 (the first exposed point) and the first region B12 (the second exposed point) in the pattern-formed region L, and the predetermined distance "y" are related according to Equation 2.

$$z = y / \cos \theta_2 \qquad \text{<Equation 2>}$$

After exposing the first region B12 to the second spot beam, the substrate SUB is moved in the negative first direction −D1 so that the third micro-mirror corresponding to the third spot beam region A13 (shown in FIG. 3) reaches the pattern-formed region L. Then, the third micro-mirror receives the activating data to irradiate the third spot beam in the pattern-formed region L. The first micro-mirror receives the inactivating data after the first micro-mirror is moved from the first spot beam region A11 to a first outer region A10 by the operating interval "t." The second micro-mirror receives the inactivating data after the second micro-mirror is moved from the first region B12 to a second outer region B13 by the operating interval "t."

A positional relation between the first outer region A10 and the second outer region B13 is substantially the same as that between the first spot beam region A11 and the first region B12, though actual positions of the first and second outer regions A10 and B13 are different from that of the first spot beam region A11 and the first region B12.

In addition, although not explained in detail, a relation between the first spot beam region A11 and the first region B12 is substantially the same as that between the fourth spot beam region A21 (the third exposed point) and the second region B22 (the fifth exposure region).

A lattice unit UN (illustrated in the examples of FIGS. 4-5) having a parallelogram shape (which has no right-angle corner) and including vertices corresponding to the first spot beam region A11, the first region B12, and the first and second outer regions A10 and B13 is defined. A straight line connecting the first exposed point with the second exposed point is defined as a first side of the lattice unit UN. A straight line connecting the first spot beam region A11 with the first region B12 and a straight line connecting the first outer region A10 with the second outer region B13 are defined as the first sides of the lattice unit UN. In addition, a straight line connecting the first spot beam region A11 with the first outer region A10 and a straight line connecting the first region B12 with the second outer region B13 are defined as second sides of the lattice unit UN. A length of each of the first sides is substantially the same as a distance "z" between the first spot beam region A11 as the first exposed point and the first region B12 as the second exposure region in the pattern-formed region L. A length of each of the second sides is substantially the same as the operating interval "t."

When the digital exposure device exposes the pattern-formed region L, the pattern-formed region L is divided to a plurality of the lattice units UN having a parallelogram shape. Based on the above, the operator connects the vertices of the lattice units UN with each other, forming a lattice pattern repeatedly arranged in the second direction D2 and the first direction D1 to determine a design of the pattern-formed region L, and the spot beams 240 provided from the digital exposure device are selectively irradiated to the preset design.

Figure 5:
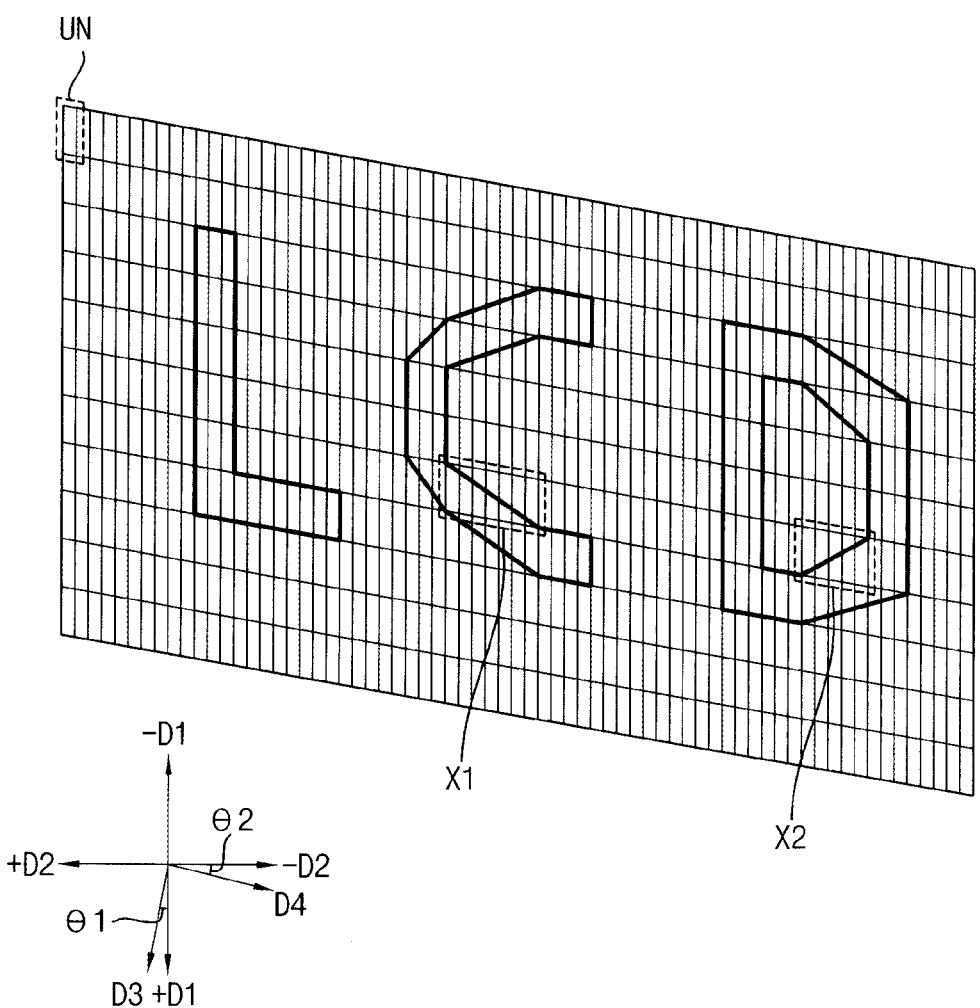
FIG. 5 is a plan view illustrating a design tool of a digital mask based on the relation of the exposed positions in FIG. 4.

FIG. 5 is a plan view illustrating a design tool of a digital mask based on the relation of the exposed positions in FIG. 4.

Referring to FIG. 5, the operator designs a digital mask using a design tool having the lattice unit UN having a parallelogram shape in the forth direction D4 and the positive first direction +D1 repetitively arranged. When the digital exposure device 200 (illustrated in the example of FIG. 1) inclines with respect to the substrate SUB by the first angle $\theta_1$ and the substrate SUB is moved in the negative first direction −D1 opposite to the scanning direction MD to expose the substrate SUB, the operator designs a predetermined pattern by connecting the lattice units UN with each other in the design tool and inputs an image data signal with respect to the predetermined pattern to the digital exposure device. Actually, since the spot beams 240 are irradiated along the first sides of the lattice units UN to (partially) overlap with each other, substantially the same regions on the substrate SUB are exposed or not exposed according to the predetermined pattern designed by the operator are exposed. Thus, the predetermined pattern may have substantially the same shape as a pattern actually formed.

For example, when the vertices of the lattice units UN are connected to each other to design a text "LCD" using the design tool and the image data signal corresponding to the text "LCD" is input to the digital exposure device 200, regions corresponding to the text "LCD" are selectively exposed, and the other region is blocked from being exposed. Alternatively, the regions corresponding to the text "LCD" may be blocked from being exposed, and the other region may be exposed. Whether the regions designed are exposed or not may depend on a positive type or a negative type of a photoresist layer as the photosensitive layer. The fourth direction D4 is substantially the same as a longitudinal direction of the first side of the lattice units UN.

For example, the fourth direction D4 in a design connecting the first sides of the lattice units UN with each other may be substantially the same as a longitudinal direction. Alternatively, the fourth direction D4 may be a direction connecting the vertices different from each other of the lattice units UN. In an example embodiment, in a grouping unit X1 including seven lattice units UN, an entire shape of the grouping unit X1 has a parallelogram shape, and the parallelogram-shaped grouping unit X1 is defined including four vertices. Then, a direction of a straight line connecting the two uttermost vertices of the four vertices in the grouping unit X1 is the fourth direction D4. Alternatively, in a grouping unit X2 including five lattice units UN, a direction of a straight line connecting the two uttermost vertices of the four vertices in the grouping unit X2 is the fourth direction D4.

Figure 6:
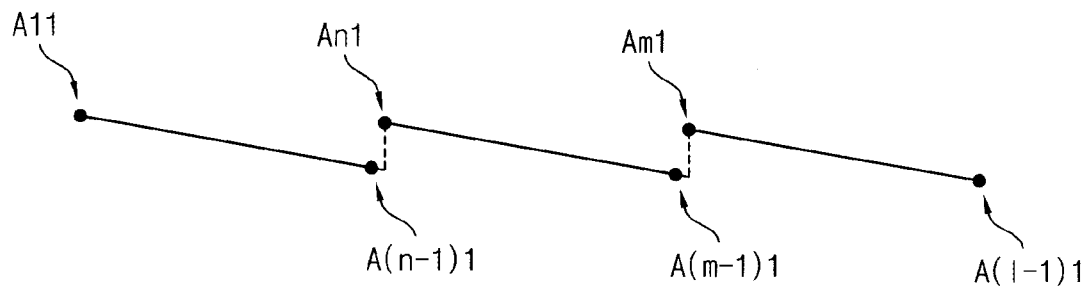
FIG. 6 is a plan view illustrating an exposed position by spot beams when (n+m+l)−1 lattice units in the design tool in FIG. 4 are arranged in a fourth direction.

FIG. 6 is a plan view illustrating an exposed position by spot beams when of (n+m+l)−1 lattice units in the design tool discussed with reference to FIG. 5 are arranged in a fourth direction.

Referring to FIG. 6, although the lattice units UN are shown as inclining in the fourth direction D4 in a relatively small area in FIG. 5, an n-th spot beam region An1 disposed at the n-th from the first spot beam region A11 (the first exposure point) is disposed on a straight line extending in the second direction D2, not the fourth direction D4, when the lattice units UN of about (n+m+1)−1 are arranged in the fourth direction D4 in relatively large area compared to the area in FIG. 5. The n-th spot beam region An1 may be a "first exposed point" substantially the same as the first spot beam region A11 except that the n-th spot beam region An1 is disposed in the second direction D2 of the first spot beam region A11, related to an exposed position. In addition, an m-th spot beam region Am1 disposed at the m-th in the fourth direction D4 from the n-th spot beam region An1 is disposed on the straight line extending in the second direction D2. In one or more embodiments, "m" and "n" may be substantially the same with each other.

The micro-mirrors 222 of the digital exposure device are disposed on the straight line extending in the second direction D2 by a fixed period. Thus, although a straight line pattern extending in the fourth direction D4 is designed using the design tool, the micro-mirror 222 is disposed in the n-th spot beam region An1 after being disposed in an (n−1)th spot beam region A(n−1)1 so that the n-th spot beam region An1 is disposed in the negative first direction −D1 of the (n−1)th spot beam region A(n−1)1. The values of "m," "n," and "l" may vary according to a size of the digital exposure device 200 or a size of the design tool.

Although not shown in figures, the operator designs a pattern using the design tool discussed with reference to FIG. 5 and the image data signal corresponding to the pattern is input to the digital exposure device 200 so that the region corresponding to the pattern or the other region excluding the region corresponding to the pattern is exposed. Therefore, the photosensitive layer formed on the exposed substrate SUB is also exposed, and the photosensitive layer exposed is developed to form a photosensitive pattern of ridges or trenches. The photosensitive pattern may protect patterns formed between the photosensitive pattern and the substrate SUB. Alternatively, when a thin film (not shown) is formed between the photosensitive pattern and the substrate SUB, the thin film may be patterned using the photosensitive pattern as an etch stopping layer, and the photosensitive pattern is removed to form a thin film pattern on the substrate SUB.

Hereinafter, a method of manufacturing a display substrate, which utilizes the method of patterning the photosensitive layer to form the photosensitive pattern discussed with reference to FIGS. 1 to 6, and the display substrate manufactured using the manufacturing method will be discussed with reference to FIGS. 7 to 16. Hereinafter, a first direction +D1 and −D1, a second direction +D2 and −D2, a third direction D3 and a fourth direction D4 in FIGS. 7 to 16 are substantially the same as illustrated in FIG. 2A. Thus, any repetitive descriptions may be omitted.

Figure 7:
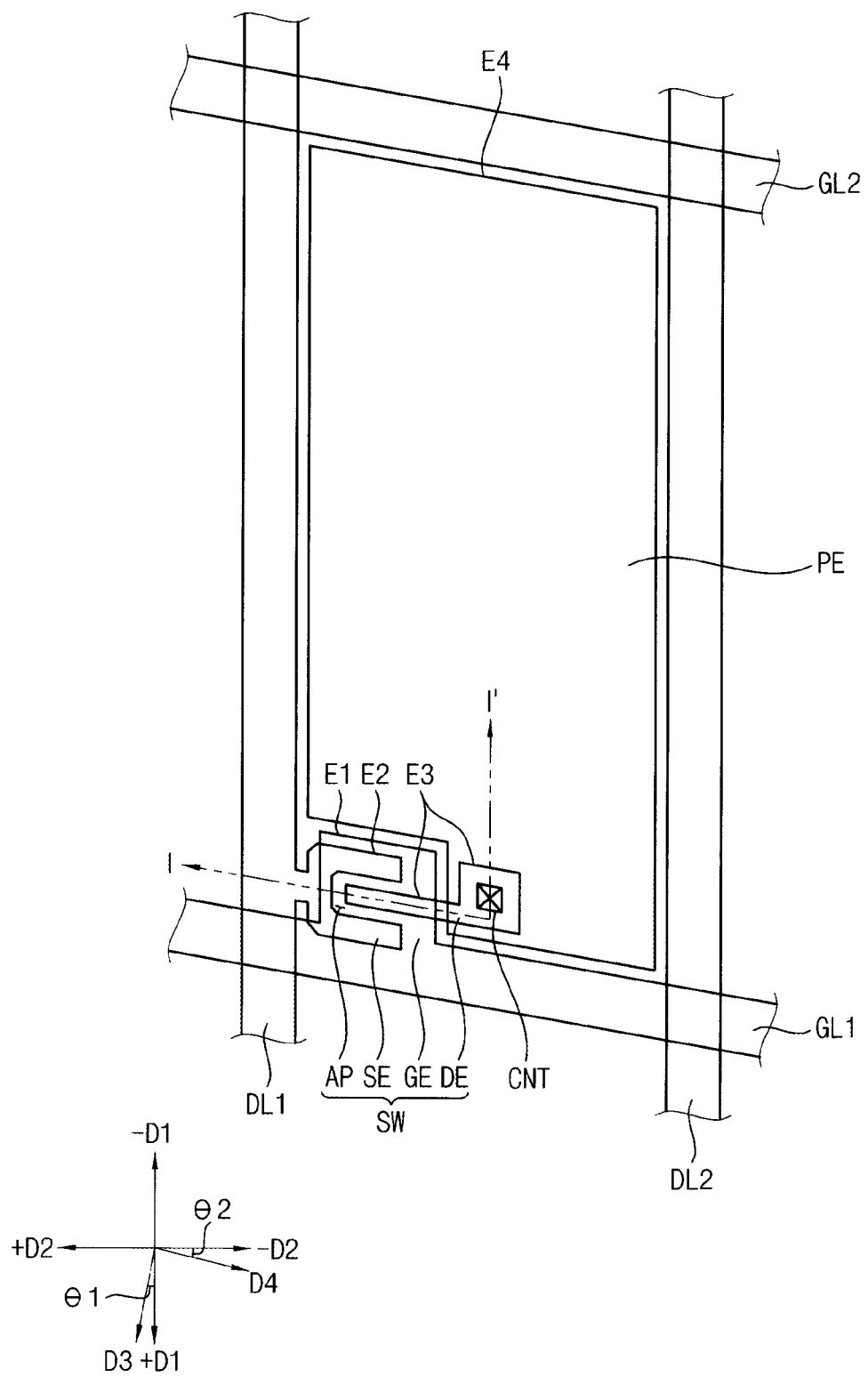
FIG. 7 is a plan view illustrating a display substrate according to one or more embodiments of the present invention.
Figure 8:
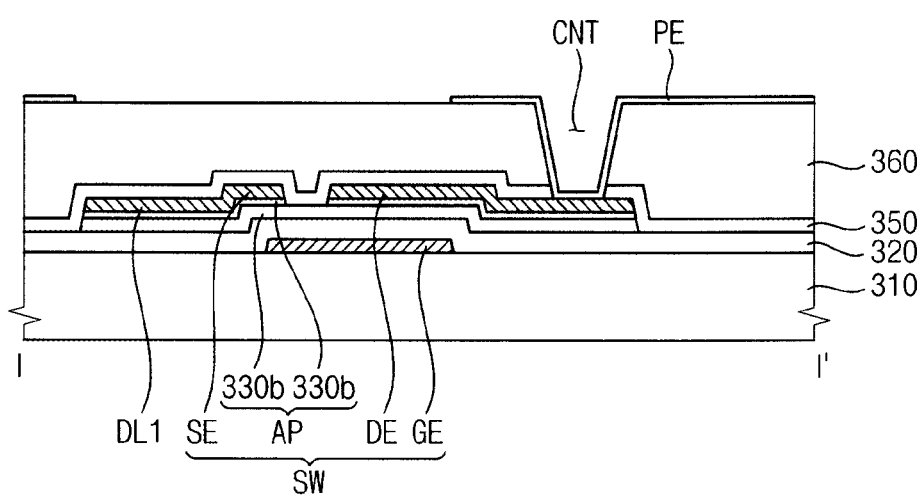
FIG. 8 is a sectional view taken along a line I-I' in FIG. 7.

FIG. 7 is a plan view illustrating a display substrate according to one or more embodiments of the present invention, and FIG. 8 is a sectional view taken along a line I-I' in FIG. 7.

Referring to FIGS. 7 and 8, a display substrate includes first and second data line DL1 and DL2, first and second gate lines GL1 and GL2, a switching element SW connected to the first gate line GL1 and the first data line DL1, and a pixel electrode PE. The display substrate further includes a gate insulating layer 320, a passivation layer 350 and an organic insulating layer 360.

The first and second data lines DL1 and DL2 extend in the first direction +D1 and −D1, and are spaced apart from each other in the second direction +D2 and −D2 substantially perpendicular to the first direction +D1 and −D1.

The first and second gate lines GL1 and GL2 extend in the fourth direction D4, and are spaced apart from each other in the first direction +D1 and −D1.

The switching element SW includes a gate electrode GE connected to the first gate line GL1, a source electrode SE connected to the first data line DL1, a drain electrode DE spaced apart from the source electrode SE, and an active pattern AP. The gate electrode GE protrudes from the first gate line GL1 in the negative first direction −D1. An edge portion E1 of the gate electrode GE (which protrudes in the negative first direction −D1) extends in a fourth direction D4. The source electrode SE includes an edge portion E2 partially extending in the fourth direction D4, and the drain electrode DE includes an edge portion E3 partially extending in the fourth direction D4. The active pattern AP partially overlaps with the gate electrode GE, and is disposed under the first and second data lines DL1 and DL2 and the source and drain electrodes SE and DE. The active pattern AP includes a semiconductor layer 330a and an ohmic contact layer 330b sequentially formed on the gate insulating layer 320. An edge of the active pattern AP may include an edge portion (not shown) extending in the fourth direction D4. A plan structure and a cross-sectional structure of the active pattern AP, except for a channel region as a spaced region between the source and drain electrodes SE and DE, are substantially the same as those of the source and drain electrode SE and DE and the first and second data lines DL1 and DL2.

The pixel electrode PE directly makes contact with the drain electrode DE through a contact hole CNT. An edge portion E4 of the pixel electrode PE adjacent to the first and second gate lines GL1 and GL2 extends in the fourth direction D4.

The contact hole CNT is a hole formed through the passivation layer 350 and the organic insulating layer 360, and partially exposes the drain electrode DE. The contact hole CNT is defined by being surrounded by first sidewalls of the passivation layer 350 extending in the first directions D1 and second sidewalls connected to the first sidewalls and extending in the fourth direction D4. The contact hole CNT has a parallelogram shape in a plan view of the display substrate.

The gate insulating layer 320 is formed on a base substrate 310 on which a gate pattern including the first and second gate lines GL1 and GL2 and the gate electrode GE is formed. The gate insulating layer 320 may entirely cover the gate pattern.

The passivation layer 350 covers the base substrate 320 on which a source pattern including the first and second data lines DL1 and DL2 and the source and drain electrodes SE and DE are formed. In addition, the passivation layer 350 includes a first hole partially exposing the drain electrode DE.

The organic insulating layer 360 covers the base substrate 320 on which the passivation layer 350 is formed, and includes a second hole corresponding to the first hole. The contact hole CNT is defined by the first and second holes. The pixel electrode PE is formed on the organic insulating layer 350. Alternatively, the organic insulating layer 360 may be omitted, and the pixel electrode PE may be directly formed on the passivation layer 350. Then, the first hole may be defined as the contact hole CNT.

Figure 9:
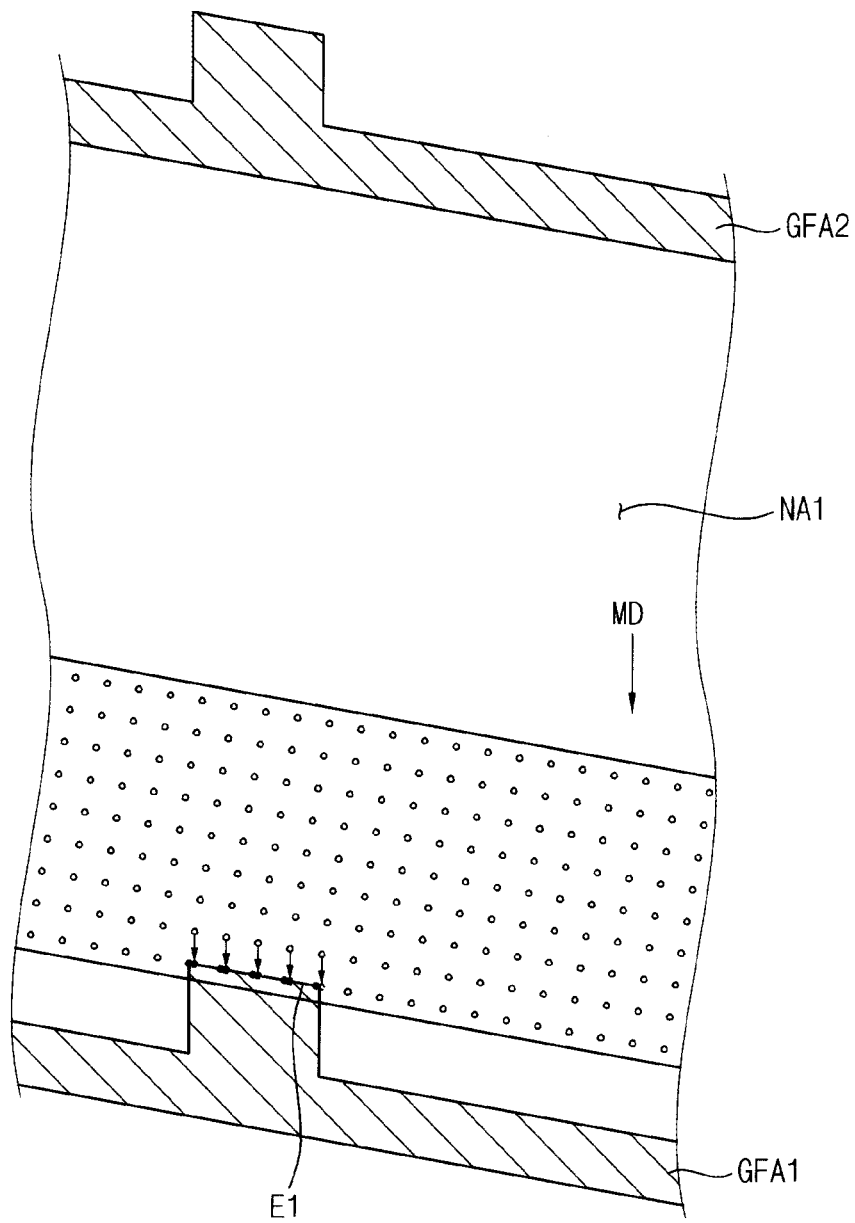
FIG. 9 is a plan view illustrating forming a gate pattern illustrated in FIGS. 7 and 8 in accordance with one or more embodiments of the invention.
Figure 9:
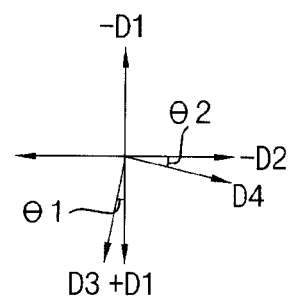

FIG. 9 is a plan view illustrating forming a gate pattern illustrated in FIGS. 7 and 8 in accordance with one or more embodiments of the invention.

Referring to FIG. 9, a gate metal layer is formed on the base substrate 310 and a photoresist layer is formed on the base substrate 310 on which the gate meal layer is formed. The photoresist layer includes a photoresist composition of a positive type removed in an exposed region and remained in a light-blocking region after developing the photoresist layer. A digital exposure device is disposed over the base substrate 310 on which the photoresist layer is formed. The digital exposure device may be substantially analogous to the digital exposure device 200 discussed with reference to FIGS. 1, 2A, and 2B, and thus any repetitive descriptions may be omitted.

The base substrate 310 on which the photoresist layer is formed and disposed under the digital exposure device (which is stationary) is moved along a direction opposite to the scanning direction MD. The scanning direction MD is substantially the same as the positive first direction +D1. In moving the substrate 310, micro-mirrors of the digital exposure device selectively receive activating data or inactivating data so that spot beams are irradiated in a first peripheral region NA1 outside a gate formed region GFA1 and a second gate formed region GFA2. Since the gate metal layer is remains in the first and second gate formed regions GFA1 and GFA2 after etching, the photoresist layer in the first and second gate formed regions GFA1 and GFA2 is not exposed to light provided by the digital exposure device, in order to remain the photoresist layer in the first and second gate formed regions GFA1 and GFA2.

In a plurality of spot beams shown in FIG. 9, micro-mirrors corresponding to spot beam regions overlapping with the first and second gate formed regions GFA1 and GFA2 receive inactivating data, and the micro-mirrors corresponding to spot beam regions overlapping with the first peripheral region NA1 receive activating data to irradiate the spot beams on the photoresist layer formed in the first peripheral region NA1. The control of turning on/off the micro-mirrors corresponding to the spot beam regions as the base substrate 310 moves along the direction opposite to the scanning direction MD may be substantially analogous to what is illustrated with reference to FIGS. 2A, 2B, 3 and 4, and thus any repetitive descriptions may be omitted.

The first and second gate formed regions GFA1 and GFA2 are designed to form the first and second gate lines GL1 and GL2 extending in the fourth direction D4, and a portion of an edge portion E1 of the gate electrode GE is designed to extend in the fourth direction D4, by the operator. Each of the first and second lines GL1 and GL2 includes an edge portion E4 extending in the fourth direction D4. Thus, when the photoresist layer is exposed using the digital exposure device and is developed to form a first photoresist pattern, a shape of the first photoresist pattern is substantially the same as the designs of the first and second gate formed regions GFA1 and GFA2 designed by the operator. The gate metal layer is patterned using the first photoresist pattern to form a gate pattern including the first and second gate lines GL1 and GL2 and the gate electrode GE on the base substrate 310 illustrated in FIGS. 7 and 8.

Figure 10:
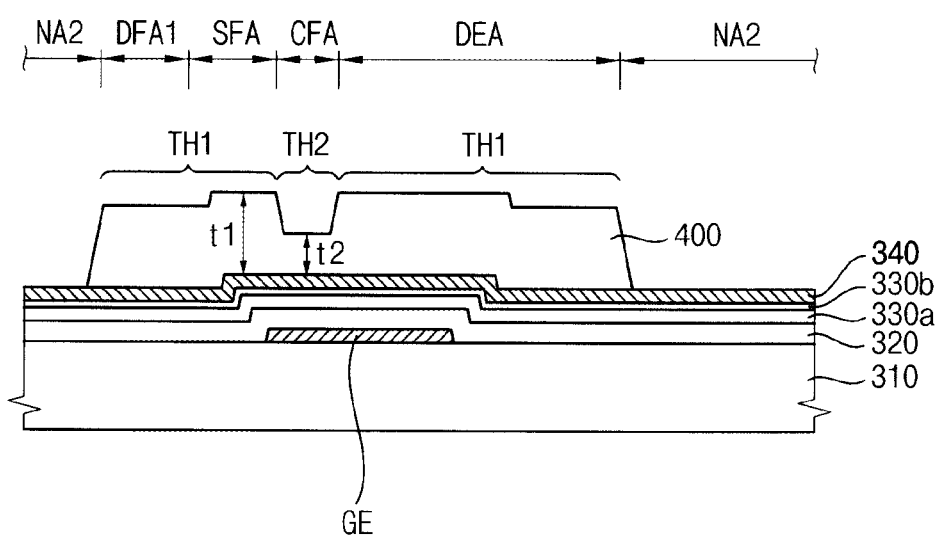
FIG. 10 is a cross-sectional view illustrating forming a source pattern and an active pattern illustrated in FIGS. 7 and 8.

FIG. 10 is a cross-sectional view illustrating forming a source pattern and an active pattern illustrated in FIGS. 7 and 8.

Referring to FIG. 10, the gate insulating layer 320, the semiconductor layer 330a, the ohmic contact layer 330b, a data metal layer 340 and a second photoresist pattern 400 are sequentially formed on the base substrate 310 on which the gate pattern is formed.

The gate insulating layer 320, the semiconductor layer 330a, the ohmic contact layer 330b and the data metal layer 340 are formed on an entire surface of the base substrate 310. The second photoresist pattern 400 is formed in a first data formed region DFA1, a source formed region SFA, a channel formed region CFA and a drain formed region DEA. The data metal layer 340 is exposed in a second peripheral region NA2 except for the first data formed region DFA1, the source formed region SFA, the channel formed region CFA and the drain formed region DEA.

The second photoresist pattern 400 includes a first thickness portion TH1 formed in the first data formed region DFA1, the source formed region SFA and the drain formed region DEA and a second thickness portion TH2 formed in the channel formed region CFA. A first thickness $t_1$ of the first thickness portion TH1 is larger than a second thickness $t_2$ of the second thickness portion TH2.

The source metal layer 340, the ohmic contact layer 330b and the semiconductor layer 330a are firstly etched using the second photoresist pattern 400 as an etch stopping layer, and the first thickness portion TH1 of the second photoresist pattern 400 is removed to form a residual pattern (not shown) exposing the data metal layer 340 in the channel formed region CFA and having a thickness smaller than the first thickness $t_1$.

The data metal layer 340 and the ohmic contact layer 330b in the channel formed region CFA are removed using the residual pattern as an etch stopping layer to form the source pattern including the first and second data lines DL1 and DL2 and the source and drain electrodes SE and DE, and the active pattern AP disposed under the source pattern.

Hereinafter, an exposure process forming the second photoresist pattern 400 in forming the source pattern and the active pattern AP in FIG. 10 will be illustrated referring to FIGS. 11, 12 and 13.

Figure 11:
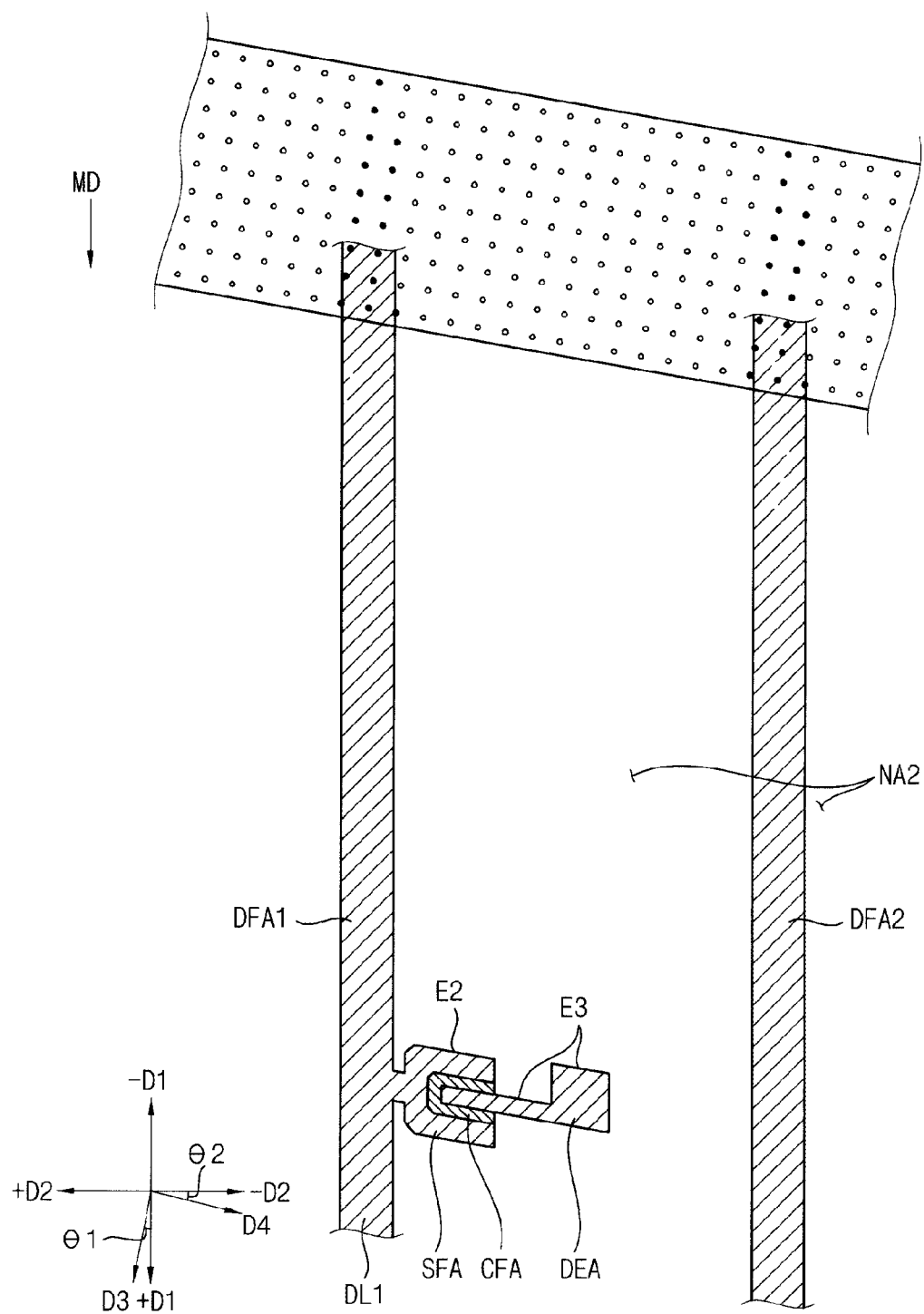
FIGS. 11 and 12 are plan views illustrating forming the source pattern and the active pattern illustrated in FIGS. 7 and 8 in accordance with one or more embodiments of the invention.
Figure 12:
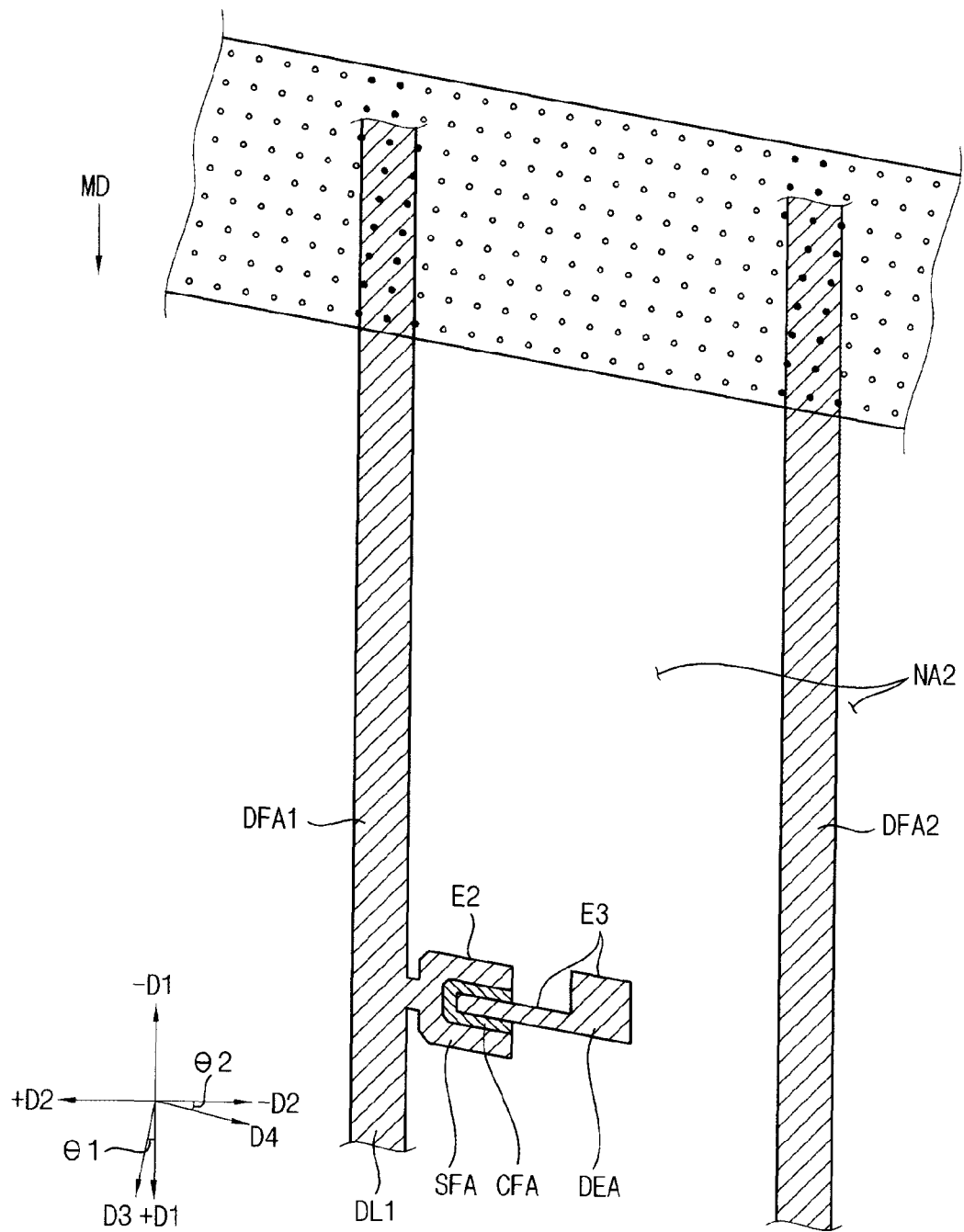
Figure 13:
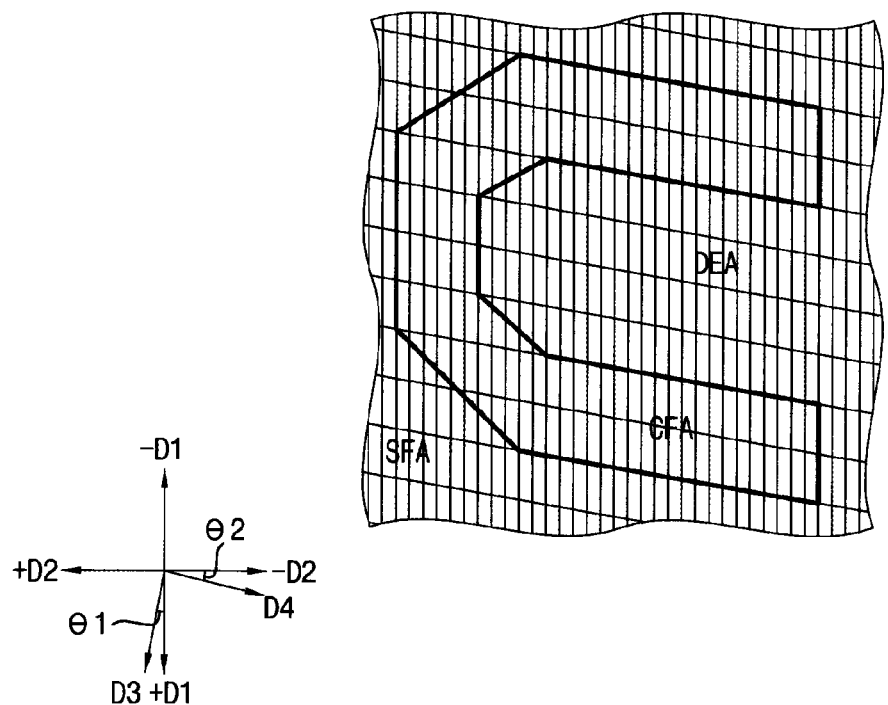
FIG. 13 is an enlarged view illustrating a digital mask corresponding to a channel region illustrated in FIGS. 11 and 12.

FIGS. 11 and 12 are plan views illustrating forming the source pattern and the active pattern in FIGS. 7 and 8 in accordance with one or more embodiments of the invention, and FIG. 13 is an enlarged view illustrating a digital mask corresponding to a channel region in FIGS. 11 and 12.

Referring to FIGS. 11 and 12, a photoresist layer is formed on the data metal layer 340, and the base substrate 310 on which the photoresist layer is formed is exposed using the digital exposure device. The digital exposure device may be substantially analogous to that illustrated referring to FIGS. 1 and 2A, and thus any repetitive descriptions may be omitted. The photoresist layer may include a photoresist composition of a positive type.

In a plurality of spot beams shown in FIG. 11, micro-mirrors corresponding to spot beam regions overlapping with the first and second data formed regions DFA1 and DFA2 receive inactivating data, and micro-mirrors corresponding to spot beam regions overlapping with the second peripheral region NA2 receive activating data to irradiate the spot beams on the photoresist layer formed in the second peripheral region NA2. In addition, in the spot beam regions, micro-mirrors corresponding to spot beam regions overlapping with the source and drain formed regions SFA and DEA and the channel formed region CFA receive the inactivating data.

As described in FIG. 12, the base substrate 310 is moved along the direction opposite to the scanning direction MD so that the on/off pattern of the micro-mirrors corresponding to the spot beams is different from that illustrated in FIG. 11. The control of turning on/off the micro-mirrors may be substantially analogous to that illustrated referring to FIGS. 2A, 2B, 3 and 4, and thus any repetitive descriptions may be omitted.

Referring to FIG. 13, in order to form the second thickness portion TH2 in the channel formed region CFA, image data are input to the digital exposure device based on a design of a digital mask drawn in a design tool including a lattice unit UN having a parallelogram shape. A light intensity provided to the channel formed region CFA may be larger than that provided to the source and drain electrode regions SFA and DEA, and may be smaller than that provided to the second peripheral region NA2. In order to provide the light intensity different from each other to each region, the number of the spot beams per unit area in each region may be adjusted. When the number of the spot beams per unit area is increased, the light intensity is increased.

Since an electric characteristic of the switching element SW may be changed by a channel length and/or a channel width of a channel of the switching element SW formed in the channel formed region CFA, the switching element SW has a shape theoretically designed. If a portion of a display substrate, for example, a channel region, is designed using a general design tool including a lattice unit having a square shape or rectangle shape and the second photoresist pattern 400 is formed, the channel region may be differently exposed from a shape actually designed and may not be uniformly exposed.

In one or more embodiments of the invention, the channel formed region CFA is designed using a design tool including a lattice unit having a parallelogram shape as shown in FIG. 13 and the image data based on the design tool is input to the digital exposure device, so that the spot beams may be actually irradiated to the same position as the position theoretically determined to be exposed. Thus, the reliability of forming the second photoresist pattern 400 may be improved, and the reliability of the source pattern and the active pattern AP formed using the second photoresist pattern 400 may be improved.

Figure 14:
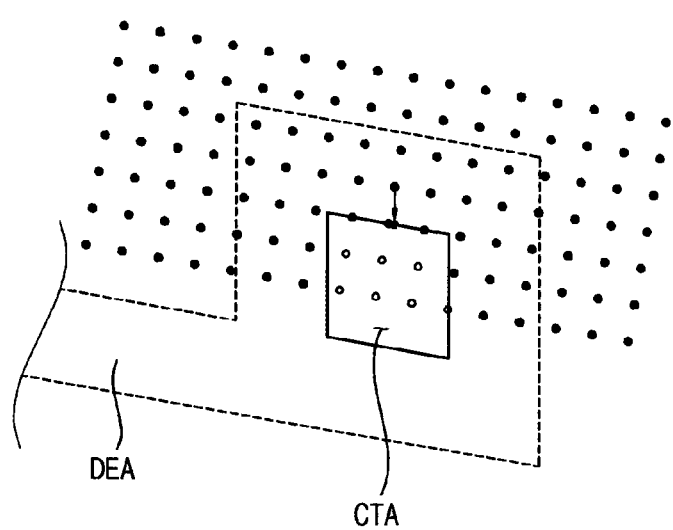
FIG. 14 is an enlarged view illustrating forming a contact hole illustrated in FIGS. 7 and 8 in accordance with one or more embodiments of the invention.

FIG. 14 is an enlarged view illustrating forming a contact hole in FIGS. 7 and 8 in accordance with one or more embodiments of the invention.

Referring to FIG. 14 with FIGS. 7 and 8, the passivation layer 350 and the organic insulating layer 360 are sequentially formed on the base substrate 310 on which the source pattern and the active pattern AP are formed. The passivation layer 350 may include silicon nitride or silicon oxide, etc. The organic insulating layer 360 may be formed from a photosensitive composition. The organic insulating layer 360 may be substantially the same as a photoresist composition of a positive type removed in a light-emitted region and retained in a light blocking region.

The digital exposure device is disposed over the base substrate 310 on which the organic insulating layer 360 is formed, and the base substrate 310 is moved in the direction opposite to the scanning direction MD, so that a contact hole formed region CTA corresponding to the contact hole CNT is selectively exposed. The organic insulating layer 360 in the remaining region (other than the contact hole formed region CTA) is not exposed and remains to protect the switching element SW. The process of selectively exposing the contact hole formed region CTA to the light may be substantially analogous to what is illustrated with reference to FIGS. 2A, 2B, 3 and 4, and thus any repetitive descriptions may be omitted.

The organic insulating layer 360 is developed to form the second hole in the contact hole formed region CTA, and the passivation layer 350 is etched using the organic insulating layer 360 in which the second hole is formed as an etch stopping layer to form the first hole. Therefore, the contact hole CNT partially exposing the drain electrode DE is formed in the passivation layer 350 and the organic insulating layer 360.

An electrode layer is formed on the base substrate 310 on which the contact hole CNT is formed and is patterned using a third photoresist pattern (not shown) as an etch stopping layer to form the pixel electrode PE. The third photoresist pattern may be formed using the digital exposure device.

Thus, the display substrate shown in FIGS. 7 and 8 is manufactured using the digital exposure device in accordance with one or more embodiments of the invention.

According to the present example embodiment, when an operator manufactures at least one of the gate pattern, the source pattern, the active pattern AP, the contact hole CNT and the pixel electrode PE using the digital exposure device, a design tool including lattice units each having a parallelogram shape which is based on an exposure characteristic of the digital exposure device is used for designing so that a reliability of products actually manufactured may be improved. Therefore, although manufacturing conditions are changed, the operator may predict actually exposed positions so that the thin-film pattern may be easily redesigned to improve the reliability of manufacturing the pattern.

Figure 15:
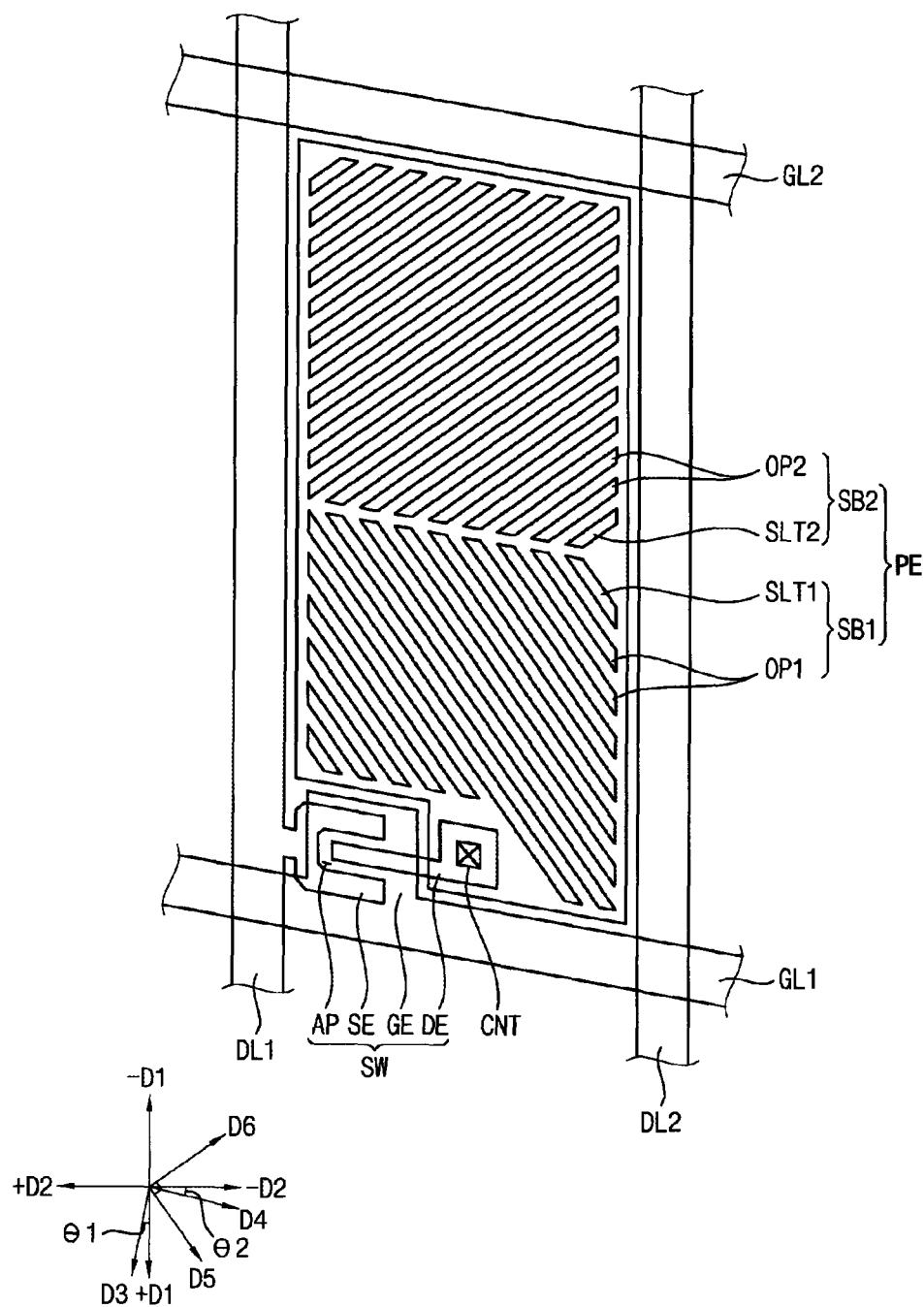
FIG. 15 is a plan view illustrating a display substrate according to one or more embodiments of the present invention.

FIG. 15 is a plan view illustrating a display substrate according to one or more embodiments of the present invention.

Referring to FIG. 15, a display substrate includes first and second data lines DL1 and DL2, first and second gate lines GL1 and GL2, a switching element SW connected to the first gate line GL1 and the first data line DL1, and a pixel electrode PE. The display substrate shown in FIG. 15 may be substantially as analogous to the display substrate illustrated in FIG. 7 except that the pixel electrode PE includes a first sub electrode SB1 and a second sub electrode SB2. In addition, a cross-sectional view of the display substrate in FIG. 15 is substantially the same as that of the display substrate in FIG. 8 except for a shape of the pixel electrode PE. Thus, any repetitive descriptions will be omitted.

The first and second data lines DL1 and DL2 extend in a first direction +D1 and –D1. The first and second gate lines GL1 and GL2 extend in a fourth direction.

The pixel electrode includes the first sub electrode SB1 and the second sub electrode SB2. The first sub electrode SB1 is disposed adjacent to the switching element SW and the first gate line GL1, and the second sub electrode SB2 is disposed adjacent to the second gate line GL2.

The first sub electrode SB1 includes a plurality of first slit electrodes SLT1 extending in a fifth direction D5 between a positive first direction +D1 and the fourth direction D4. The first slit electrodes SLT1 are respectively defined as first opening portions OP1 extending in the fifth direction D5 and disposed adjacent to each other. An angle counterclockwise formed by the fifth direction D5 and a negative second direction –D2 with respect to the negative second direction –D2 may be less than about 45°.

The second sub electrode SB2 includes a plurality of second slit electrodes SLT2 extending in a sixth direction D6 between a negative first direction –D1 and the negative second direction –D2. The second slit electrodes SLT2 are defined as second opening portions OP2 adjacent to each other. An angle counterclockwise formed by the sixth direction D6 and the negative second direction –D2 with respect to the negative second direction –D2 may be larger than about 45°. For example, an angle formed by the sixth direction D6 and the fifth direction D5 may be about 90° considering directions of polarized plates of a display panel including the display substrate.

Figure 16:
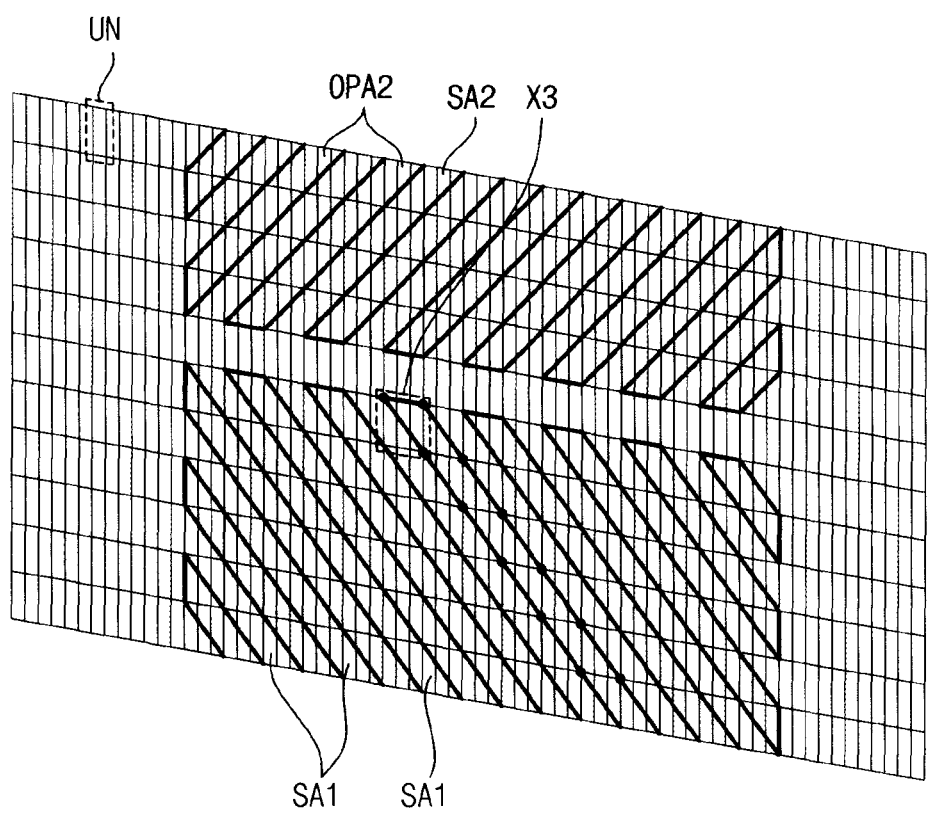
FIG. 16 is a plan view partially illustrating a digital mask used for forming a pixel electrode in FIG. 15.
Figure 16:
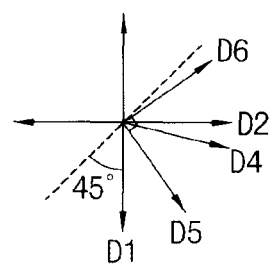

Extending each of the first and second slit electrodes SLT1 and SLT2 in the fifth direction D5 and the sixth direction D6 is explained with a method of manufacturing the display substrate in FIG. 15 using a digital mask shown in FIG. 16.

Hereinafter, the method of manufacturing the display substrate in FIG. 15 will be illustrated referring to FIGS. 15 and 16. The method of manufacturing the display substrate in FIG. 15 may be substantially as analogous to what is illustrated in FIGS. 9 to 14 with a difference being that the digital mask shown in FIG. 16 is used for forming the pixel electrode PE. Thus, any repetitive descriptions may be omitted, and forming the pixel electrode PE shown in FIG. 15 will be illustrated referring to FIG. 16.

FIG. 16 is a plan view partially illustrating a digital mask used for forming a pixel electrode in FIG. 15.

Referring to FIGS. 15 and 16, an electrode layer (not shown) is formed on a base substrate and a photoresist layer (not shown) is formed on the electrode layer. The base substrate on which the photoresist layer is formed is exposed using a digital exposure device to form a photoresist pattern.

Image data input to the digital exposure device may be substantially analogous to those shown in FIG. 16 in order to form the photoresist pattern. A design shown in FIG. 16 is a digital mask for forming the photoresist pattern and a design of the digital mask is determined using a design tool including lattice units UN having a parallelogram shape.

If a digital mask including an oblique line pattern having a slope of about 45° or about 130° is designed using a design tool including lattice units of a square shape, vertices diagonally facing each other are connected to each other to determine the oblique line pattern. However, if a pattern is formed based on the oblique line pattern determined by the design tool including the lattice units of the square shape and is formed using the digital exposure device, a light is hardly irradiated to an entire oblique line pattern uniformly. In one or more embodiments of the invention, a digital mask shown in FIG. 16 is designed using a lattice unit UN of a parallelogram shape determined by reflecting an exposure characteristic of the digital exposure device, and the oblique line pattern designed by the method illustrated in FIGS. 1 and 4 using the digital exposure device may be uniformly and entirely exposed. The oblique line pattern designed based on the exposure characteristic may be inclined more than about 45° or about 135°.

A digital mask shown in FIG. 16 includes a first slit region SA1 corresponding to the first slit electrode SLT1, a first opening pattern OPA1 corresponding to the first opening portion OP1, a second slit region SA2 corresponding to the second slit electrode SLT2, and a second opening pattern PA2 corresponding to the second opening portion OP2. The fourth direction D4 in the digital mask is substantially the same direction as a line connecting a left lower vertex of a first lattice unit in a grouping unit X3 including three lattice units with a right lower vertex of a third lattice unit disposed at the second from the first lattice unit. Therefore, the fourth direction D4 or the fifth direction D5 in the digital mask may be determined by a direction of a line connecting a vertex of a first lattice unit with a vertex of the (n+1)-th lattice unit disposed at the n-th from the first lattice unit in a grouping unit including the first lattice unit to the (n+1)-th lattice unit. FIG. 16 illustrates that the grouping unit X3 includes one lattice unit in the first direction D1, but alternatively, the grouping unit X3 may have m×n array including m lattice units arranged in the first direction D1 and n lattice units arranged in the fourth direction D4.

The mask design shown in FIG. 16 is input to the digital exposure device and the photoresist layer is patterned using the digital exposure device to form the photoresist pattern. The photoresist pattern may have substantially the same shape as designed by the operator. The electrode layer is patterned using the photoresist pattern as an etch stopping layer to form the pixel electrode PE shown in FIG. 15.

According to the above descriptions, the design tool including the lattice units UN having a parallelogram shape based on the exposure characteristic of the digital exposure device is used and a grouping unit including the lattice units UN of "n" is defined in order to form the oblique line pattern inclined by an angle of about 45° or about 135° to design a digital mask using the grouping unit. In FIG. 16, three lattice units UN are defined as one grouping unit, and thus a reliability forming a thin film pattern, particularly having an oblique line pattern may be improved.

As described above in detail, a thin-film pattern is designed such that an edge portion of the thin-film pattern extends along a direction inclined with respect to a longitudinal direction of a side of a base substrate and/or with respect to the relative movement direction of the base substrate, and the thin-film pattern is formed by a digital exposure device. Thus, a final thin-film pattern is most like a theoretically designed thin-film pattern. In other words, the operator designs the thin-film pattern using a design tool including lattice units and each of the lattice units has a parallelogram shape (having no right-angle corner) which is based on an exposure characteristic of the digital exposure device, so that the final manufactured thin-film pattern is most like the theoretically designed thin-film pattern even though the thin-film pattern is formed by the digital exposure device. Therefore, although manufacturing conditions are changed, the operator may predict actually exposed positions so that the thin-film pattern may be easily redesigned to improve a reliability of manufacturing the thin-film pattern.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of forming a photosensitive pattern on a substrate, a photosensitive layer being disposed on the substrate, the method comprising:

moving at least one of the substrate and a set of micro-mirrors in a first direction, the set of micro-mirrors being disposed above the substrate and being arranged as an array, the array having a first edge extending in a second direction, a plurality of micro-mirrors of the set of micro-mirrors being arranged along the first edge and being aligned with each other in the second direction, the second direction being at an acute angle with respect to the first direction;

selectively turning on one or more micro-minors of the set of micro-mirrors according to a position of the set of micro-minors relative to the photosensitive layer, thereby irradiating one or more spot beams on the photosensitive layer; and developing the photosensitive layer exposed by the spot beams to form a photosensitive pattern having an edge portion extending in a third direction crossing the first and second directions, wherein the selectively turning on one or more micro-minors of the set of micro-mirrors comprises:

irradiating a first spot beam corresponding to a first micro-minor at a first exposed point on a pattern-formed region in which the photosensitive pattern is formed; and irradiating a second spot beam corresponding to a second micro-minor at a second exposed point on the pattern-formed region disposed in the third direction with respect to the first exposed point, the second micro-mirror being disposed in the second direction with respect to the first micro-mirror.

2. The method of claim 1, wherein when the first spot beam is irradiated, the first micro-minor is disposed over the first exposed point and receives activating data, and the second micro-mirror is disposed over a light-blocking point in a peripheral region outside of the pattern-formed region and receives inactivating data, and wherein when the second spot beam is irradiated, the second micro-mirror is disposed over the second exposed point disposed and receives the activating data, the second exposed point being in the first direction with respect to the light-blocking point.

3. The method of claim 1, wherein the photosensitive pattern is divided into a plurality of lattice units having a parallelogram shape defined by first sides facing each other and second sides respectively connecting the first sides, the parallelogram shape having no right-angle corner, a length of the first sides is substantially equal to a distance between the first exposed point and the second exposed point, a length of the second sides being substantially equal to a moving distance of the first micro-minor relative to the substrate from an on-state of the first micro-minor to an off-state of the first micro-minor.

4. The method of claim 3, wherein the third direction is substantially the same as a longitudinal direction of each of the first sides.

5. The method of claim 3, wherein at least two lattice units adjacent to each other form a grouping unit having a parallelogram shape having no right-angle corner, and wherein the third direction is substantially the same as a direction connecting two vertices farthest spaced apart from each other in four vertices of the grouping unit.

6. The method of claim 1, wherein if the acute angle between the first direction and the second direction is referred to "$\theta 1$" ($0°<\theta 1<90°$), if a distance along the second direction between the first exposed point and a second light-blocking point disposed in the second direction with respect to the first exposed point and disposed in the first direction with respect to the second exposed point is referred to "x", and if the moving distance of the first micro-mirror relative to the substrate from an on-state of the first micro-mirror to an off-state of the first micro-mirror is referred to "t", and if an additional moving distance such that the second exposed point is moved in the first direction in the pattern-formed region more than the first exposed point is referred to as "y", then $y = |n \times t - x \cos(\theta 1)|$, wherein, "n×t" is an integer multiple of "t" that is closest to "x", and "n" is an integer equal to or greater than 1).

7. The method of claim 6, wherein the third direction is substantially the same as an extending direction of a straight line connecting the first exposed point with the second exposed point.

8. The method of claim 6, wherein if an acute angle between a fourth direction substantially perpendicular to the first direction and the third direction is referred to "$\theta 2$" ($0°<\theta 2<90°$), and if a distance between the first exposed point and the second exposed point is referred to as "z", then $z = y/\cos \theta 2$.

* * * * *